United States Patent
Yanagishima et al.

(10) Patent No.: US 8,040,161 B2
(45) Date of Patent: Oct. 18, 2011

(54) DRIVE CIRCUIT DEVICE FOR A POWER SEMICONDUCTOR, AND SIGNAL TRANSFER CIRCUIT DEVICE FOR USE THEREIN

(75) Inventors: Daiki Yanagishima, Kyoto (JP); Toshiyuki Ishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 79 days.

(21) Appl. No.: 12/489,621

(22) Filed: Jun. 23, 2009

(65) Prior Publication Data
US 2009/0322380 A1 Dec. 31, 2009

(30) Foreign Application Priority Data
Jun. 24, 2008 (JP) ................. 2008-164490

(51) Int. Cl.
*H03K 3/00* (2006.01)

(52) U.S. Cl. ...................... 327/108; 327/112
(58) Field of Classification Search ........... 327/108–112
See application file for complete search history.

(56) References Cited

U.S. PATENT DOCUMENTS

| 4,912,373 | A | * | 3/1990 | Moreau | 315/209 R |
| 6,906,574 | B2 | * | 6/2005 | Ohi et al. | 327/392 |
| 7,075,329 | B2 | | 7/2006 | Chen et al. | |
| 7,746,614 | B2 | * | 6/2010 | Ishikawa et al. | 361/93.1 |

FOREIGN PATENT DOCUMENTS
JP   09-008624   1/1997

* cited by examiner

*Primary Examiner* — Kenneth B. Wells
(74) *Attorney, Agent, or Firm* — Fish & Richardson P.C.

(57) ABSTRACT

A power semiconductor drive circuit device includes: an electronic control device generating a control input signal; a signal transfer circuit device having a main path and a self-diagnosis functional block; and a power semiconductor driven by the control output signal from the signal transfer circuit device. The self-diagnosis functional block includes: a feedback pulse transmitter circuit; a second signal transfer circuit; and a second receiver circuit. The second receiver circuit compares the control output signal with the control input signal so as to find out whether the control output signal is matched or unmatched with the control input signal, and then outputs a result to a comparison signal output terminal. A signal outputted to the comparison signal output terminal is transferred to the electronic control device.

18 Claims, 8 Drawing Sheets

US 8,040,161 B2

DRIVE CIRCUIT DEVICE FOR A POWER SEMICONDUCTOR, AND SIGNAL TRANSFER CIRCUIT DEVICE FOR USE THEREIN

This application is based on Japanese Patent Application No. 2008-164490 filed on Jun. 24, 2008, the contents of which are hereby incorporated by reference.

BACKGROUND OF THE INVENTION

1. Field of the Invention

The present invention relates to a drive circuit device for a power semiconductor and to a signal transfer circuit device for use therein. More particularly, the present invention relates to what drives a so-called power semiconductor, such as a silicon-carbide (SiC) semiconductor element, an insulated gate-type bipolar transistor (IGBT), a MOSFET, and the like, that is used as a main circuit of a hybrid automobile, an electric-powered vehicle, an inverter, a servo control device, and the like.

2. Description of Related Art

FIG. 10 shows a conventional power semiconductor drive circuit device for driving a motor mounted in a hybrid automobile, etc. and a signal transfer circuit device for use therein. A power semiconductor drive circuit device 30A is provided with: an electronic control device 32; a signal transfer circuit device 300A; a power semiconductor 40; and a motor 50. The electronic control device 32 generates a control input signal for controlling the motor 50 mounted, for example, in a hybrid automobile via the power semiconductor 40. The signal transfer circuit device 300A is provided with: a transmission pulse generator circuit 320; a signal transfer circuit 330A; and a receiver circuit 340A. In the signal transfer circuit 330A, a photocoupler or a transformer is used for galvanically isolating a transmitter side and a receiver side of the signal transfer circuit device 300A.

FIG. 11 shows a signal transfer circuit device disclosed in FIG. 1 of JP-A-(H)9-8624 (hereinafter, referred to as Patent Document 1). The signal transfer circuit device disclosed therein is provided with: a transmitter circuitry portion 11; a receiver circuit portion 12; and a signal transfer circuit 17. The transmitter circuitry portion 11 is provided with: a signal generator circuit 13; a rising edge detector circuit 14; and a falling edge detector circuit 15. The receiver circuitry portion 12 is provided with a signal processing circuit 16. The signal transfer circuit 17 transmits a transfer signal generated by the transmitter circuitry portion 11 to the receiver circuitry portion 12, and is used as an isolator for both the circuitry portions. For the signal transfer circuit 17, one or two pulse transformers are used.

Patent Document 1 has a feature that in the isolator, namely the signal transfer circuit 17, a pulse transformer is used instead of a photocoupler. This leads to a reduced shift in timing for transferring signals, and hence to a further reduced power consumption.

FIG. 12 shows an isolator disclosed in FIG. 1 of U.S. Pat. No. 7,075,329 (hereinafter, referred to as Patent Document 2); an isolator 100 is provided with: a glitch filter 101; edge detectors 102 and 104; an inverter 106; transformers 108 and 120; and a flip-flop 110. The transformer 108 is formed with a primary winding 108A and a secondary winding 108B. The transformer 120 is formed with a primary winding 120A and a secondary winding 120B. The primary windings 108A and 120A, and the secondary windings 108B and 120B are connected to a ground potential A (GND A), and to a ground potential B (GND B) galvanically isolated from the ground potential A, respectively.

Moreover, with reference to FIG. 8 of Patent Document 2, a transmitter circuit 802, a top coil 806A that functions as the primary winding, the ground potential A (GND A), and the like are provided on a side of a first substrate 804; on the other hand, a receiver circuit 810, a bottom coil 806B that functions as the secondary winding, the ground potential B (GND B), and the like are provided on a side of a second substrate 808. Patent Document 2 suggests a technical idea that an isolator is so formed as to include a transformer on an IC chip.

However, what is done by the power semiconductor drive circuit device shown in FIG. 10 is to transmit, in a one-way only, a control input signal Sin generated by the electronic control device 32 to a side where the power semiconductor 40 and the motor 50 are present. Therefore, the power semiconductor drive circuit device 30A is not equipped with any means for, in an event of a malfunction occurring to the device, detecting, solving, and obviating the malfunction.

Moreover, Patent Document 1 teaches basic circuit operations assigned to the signal transfer circuit device using a pulse transformer, but fails to suggest any solutions for coping with a delay in transferring the signals and for coping with erroneous operations owing to noise. In a case where the isolator taught by the Patent Document 2 is formed on an IC chip, typically primary and secondary windings of a transformer form a multilayer by being wired with an insulating film in between on one chip. With this configuration, the insulating film lies between a top coil (a primary or a secondary winding) and a bottom coil (a secondary or a primary winding) formed on the IC chip, possibly leading to unwanted mutual interference and hence degraded electrical characteristics. Such problems may prevent a signal on a transmitter side from being transferred to a receiver side in a faithful form, thus making the signal transfer circuit fail to maximize a function inherent thereto.

SUMMARY OF THE INVENTION

The present invention has overcome the above-described problems, and has an object of providing a power semiconductor drive circuit device and a signal transfer circuit device each equipped with a self-diagnosis functional block for, if a certain change or a problem is caused in the power semiconductor drive circuit device, the signal transfer circuit device, a transmission signal, or a reception signal, detecting and monitoring that change or problem.

The term "restore" is used herein to refer to reproduction of a signal to its origin in terms of waveform and phase. When an output signal is taken as an example, a control input signal, named when inputted to a signal input terminal, undergoes various kinds of conversion and waveform-shaping before reaching a signal output terminal, and a control output signal, renamed when outputted to the signal output terminal, is restored to have a waveform and a phase of the control input signal. This resulting state is referred to as "restoration."

The term "equivalent" is used herein to refer to a difference between two signals, observed in terms of waveform and phase, falling within a predetermined range ensuring no problem is caused to a function of a relevant circuit.

The term "transmitter side" and the term "receiver side" described herein denotes a circuitry portion that engages in signal transmission and a circuitry portion that engages in signal reception, respectively. Specifically, from the viewpoint of a so-called signal sender and receiver relationship, a side that sends a signal is separated from a side that receives a signal, and the former is called a "transmitter side" and the latter is called a "receiver side." Herein, a role of a boundary between the "transmitter side" and the "sender side" is played by a first signal transfer circuit or a second signal transfer circuit which will be described later. These signal transfer circuits function as both the "transmitter side" and the "receiver side" at a time.

The phrase "galvanically isolated" is used to denote that target objects to be isolated are not connected through a conductive member.

According to the present invention, a power semiconductor drive circuit device includes: an electronic control device generating a control input signal; a signal transfer circuit device generating a control output signal restored to the control input signal; and a power semiconductor driven by the control output signal outputted from the signal transfer circuit device, wherein the signal transfer circuit device is provided with a self-diagnosis functional block comparing the control output signal with the control input signal, and then outputting, based on the comparison, a signal indicating that the two signals are "matched" or "unmatched." The electronic control device receives the output from the self-diagnosis functional block and, based on the output, then controls the signal transfer circuit device and the power semiconductor.

The power semiconductor drive circuit device configured as described above, using the self-diagnosis functional block, compares the control output signal driving the power semiconductor, with the control input signal serving as a base signal, and then transfers a signal indicating whether or not the control output signal is restored faithfully, to the electronic control device having generated the control input signal. If the two signals, namely the control output signal and the control input signal are "unmatched," that is, if the control output signal is not faithful to the control input signal as a result of restoration, the electronic control device determines that the power semiconductor drive circuit device deviates from a normal operating state, owing to a certain malfunction, external noise, or the like.

According to the present invention, a signal transfer circuit device provided with a signal input terminal receiving a control input signal, and a signal output terminal outputting a control output signal obtained by being restored to the control input signal, includes: a transmission pulse generator circuit generating a transmission pulse signal that is synchronized with the control input signal; a first signal transfer circuit transferring the transmission pulse signal to a stage succeeding thereto; a first receiver circuit receiving the transmission pulse signal outputted from the first signal transfer circuit, and then restoring the transmission pulse signal to a signal approximately equivalent to the control input signal; a signal output terminal from which the signal thus restored is outputted as a control output signal; a feedback pulse transmitter circuit generating a feedback pulse signal that is synchronized with the control output signal; a second signal transfer circuit transferring the feedback pulse signal to a succeeding stage; and a second receiver circuit receiving the control input signal and the feedback pulse signal, and then comparing the feedback pulse with the control input signal.

Moreover, according to another aspect of the present invention, in the signal transfer circuit device as described above, the transmission pulse generator circuit is provided with an edge detector detecting a rising edge and a falling edge of the control input signal, and then generating the transmission pulse signal. The first signal transfer circuit is provided with a transformer having a primary winding thereof to which the transmission pulse signal is inputted, and a secondary winding thereof from which a pulse signal approximately equivalent to the transmission pulse signal is outputted. The first receiver circuit is provided with D-flipflop outputting the signal restored to the control input signal. The feedback pulse transmitter circuit is provided with a pulse generator circuit generating the feedback pulse signal synchronized with the control output signal, and having continuous pulses during a period when the control output signal is "High" or during a period when the control output signal is "Low." The second signal transfer circuit is provided with a feedback transformer having a primary winding thereof to which the feedback pulse signal is inputted, and a secondary winding thereof from which a pulse signal approximately equivalent to the feedback pulse is outputted.

Moreover, according to yet another aspect of the present invention, in the signal transfer circuit device as described above, the transmission pulse generator circuit is provided with: a first edge detector detecting a rising edge of the control input signal, and then generating, as the transmission pulse signal, a first transmission pulse signal; and a second edge detector detecting a falling edge of the control input signal, and then generating, as the transmission pulse signal, a second transmission pulse signal. The first signal transfer circuit is provided with: a first transformer and a second transformer each having a primary winding thereof to which the first and the second transmission pulse signals are inputted, respectively, and a secondary winding thereof from which pulse signals approximately equivalent to the first and the second transmission pulse signals are outputted, respectively. The first receiver circuit is provided with an RS-flipflip having a set terminal thereof and a reset terminal thereof to which the pulse signals outputted from the secondary windings of the first and second transformers are inputted, respectively, the RS-flipflop having an output thereof transferred to the signal output terminal. The feedback pulse transmitter circuit is provided with a pulse generator circuit generating, in synchronization with the control output signal, a feedback pulse signal having continuous pulses during a period when the control output signal is "High" or during a period when the control output signal is "Low." The second signal transfer circuit is provided with a feedback transformer having a primary winding thereof to which the continuous pulses are inputted, and a secondary winding thereof from which continuous pulse signal approximately equivalent to the continuous pulses is outputted.

Moreover, according to yet another aspect of the present invention, in the signal transfer circuit device as described above, the transmission pulse generator circuit is provided with: a first edge detector detecting a rising edge of the control input signal, and then generating a first transmission pulse signal; and a second edge detector detecting a falling edge of the control input signal, and then generating a second transmission pulse signal. The first signal transfer circuit is provided with: a first transformer and a second transformer each having a primary winding thereof to which the first and the second transmission pulse signals are inputted, respectively, and a secondary winding thereof from which pulse signals approximately equivalent to the first and the second transmission pulse signals are outputted, respectively. The first receiver circuit is provided with an RS-flipflop having a set terminal thereof and a reset terminal thereof to which the pulse signals outputted from the first and second transformers are inputted, respectively. An output of the RS-flipflop is transferred to the signal output terminal. The feedback pulse transmitter circuit is provided with: a third edge detector detecting a rising edge of the control output signal outputted to the signal output terminal, and then generating a first feedback pulse signal; and a fourth edge detector detecting a falling edge of the control output signal, and then generating a second feedback pulse signal. The second signal transfer circuit is provided with: a first feedback transformer and a second feedback transformer each having a primary winding thereof to which the first and the second feedback pulses are inputted, respectively, and a secondary winding thereof from which a pulse signal is outputted. The second receiver circuit is provided with an RS-flipflop having a set terminal thereof and a reset terminal thereof to which the pulse signals outputted from the secondary windings of the first and second transformers are inputted, respectively.

As described above, the signal transfer circuit device is provided with the self-diagnosis functional block having a transmitter side thereof and a receiver side thereof isolated from each other with galvanically extremely high resistance by use of the feedback transformer, thus eliminating interference possibly arising between the transmitter side and the receiver side. Moreover, if the control output signal is not faithful to the control input signal as a result of restoration, it is determined that the power semiconductor drive circuit device deviates from a normal operating state, owing to a certain malfunction, external noise, etc., and then, for example, the signal transfer circuit device is blocked from being fed with a power source voltage and a signal so as to eliminate or avoid the occurrence of a malfunction.

Moreover, according to yet another aspect of the present invention, in the signal transfer circuit device, the second receiver circuit is provided with an exclusive OR circuit.

Moreover, according to yet another aspect of the present invention, in the signal transfer circuit device, the second receiver circuit is provided with a waveform-shaping circuit shaping the feedback pulse signal into a signal approximately equivalent to the control input signal.

Moreover, according to yet another aspect of the present invention, in the signal transfer circuit device, the primary and secondary windings, each included in each of the transformers described above, are individually connected to ground potentials provided separately from each other. With this, it is possible to isolate the transmitter side and the receiver side with increased galvanic resistance, and to eliminate effects from external noise, leading to improved noise resistance characteristics.

The power semiconductor drive circuit device and signal transfer circuit device according to the present invention are each provided with the self-diagnosis functional block; this makes it possible to detect a malfunction that may occur to the power semiconductor or the motor before it does in reality, and to set, based on a signal thus detected, the power semiconductor and the signal transfer circuit device so that they operate within their safety operating ranges.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

First Embodiment

Figure 1:
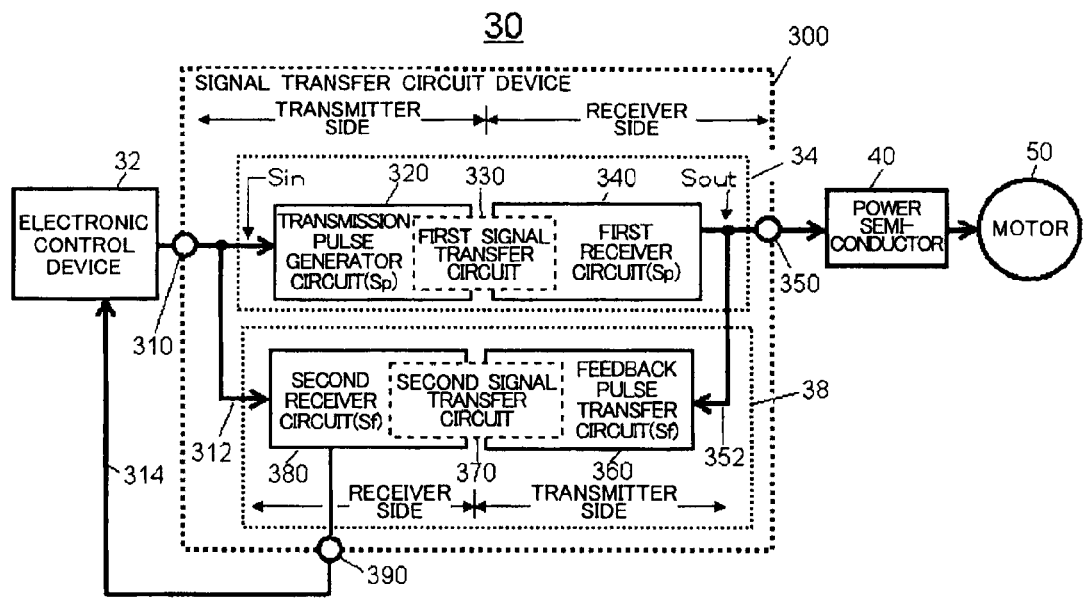
FIG. 1 is a diagram showing a power semiconductor drive circuit device according to a first embodiment of the present invention.

FIG. 1 shows a power semiconductor drive circuit device according to a first embodiment of the present invention that drives, for example, a motor. A power semiconductor drive circuit device 30 is provided with: an electronic control device 32; a signal transfer circuit device 300; and a power semiconductor 40. The electronic control device 32 transmits and receives signals to and from a control mechanism of a hybrid automobile, for example, and thereby controls an entire area of that automobile. The electronic control device 32 generates a control input signal Sin for driving the power semiconductor 40 and the motor 50.

The control input signal Sin generated by the electronic control device 32 is inputted to a signal transfer circuit 300 via a signal input terminal 310. The signal transfer circuit device 300 is provided with a main path 34 and a self-diagnosis functional block 38. The main path 34 is provided with a transmission pulse generator circuit 320; a first signal transfer circuit 330; and a first receiver circuit 340. The control input signal Sin passes through the main path 34, where signal processing is performed on the control input signal Sin, and is then inputted to the power semiconductor 40 via the signal output terminal 350. The power semiconductor 40 drives the motor 50.

The main path 34 can be divided into two sections, namely a transmitter side and a receiver side, with the first signal transfer circuit 330 serving as a boundary. The first signal transfer circuit 330 functions as both the transmitter side and the receiver side, one for two circuits.

The signal transfer circuit device 300 of the present invention is equipped with not only the main path 34, but also with the self-diagnosis functional block 38. The self-diagnosis functional block 38 is formed with: a feedback pulse transmitter circuit 360; a second signal transfer circuit 370; and a second receiver circuit 380. To the self-diagnosis functional block 38, the control input signal Sin and a control output signal Sout are inputted through a signal line 312 and through a signal line 352, respectively. The control output signal Sout inputted to the self-diagnosis functional block 38 through the signal line 352 is converted into a predetermined pulse signal by the feedback pulse transmitter circuit 360, and the resulting pulse signal is then transmitted to the second receiver circuit 380 through the second transfer circuit 370. Like the main path 34, the self-diagnosis functional block 38 can also be divided into two sections, namely a transmitter side and a receiver side, with the second signal transfer circuit 370 serving as a boundary. Such division can also be applied to a second or later embodiment which will be described later.

The second receiver circuit 380 compares the control output signal Sout with the control input signal Sin so as to determine whether they are "matched" or "unmatched." A signal indicating that they are "matched" or "unmatched" is then outputted to a comparison signal output terminal 390. The signal so outputted to the comparison signal output terminal 390 is then transferred to the electronic control device 32. For example, if that signal indicates that the two signals are "unmatched" is transferred to the electronic control device 32, the electronic control device 32 eliminates a possibility of a malfunction occurring to the power semiconductor 40, through the signal transfer circuit 300. For example, the electronic control device 32 controls the power semiconductor 40 so as to turn from an on state to an off state.

Next, the signal transfer circuit device 300 will be described in detail. The signal transfer circuit device 300 is provided with a signal input terminal 310 to which the control input signal Sin for driving a motor mounted, for example, in a hybrid automobile or an electric-powered vehicle. The transmission pulse generator circuit 320 generates a transmission pulse signal Sp that is synchronized in phase with the control input signal Sin. The transmission pulse signal Sp is inputted to the first signal transfer circuit 330. Normally, so that power consumption is reduced in the first signal transfer circuit 330, a pulse width of the transmission pulse signal Sp is set sufficiently smaller than that of the control input signal Sin.

For a main circuit of the first signal transfer circuit 330, an isolator is used for galvanically isolating the transmission pulse generator circuit 320 in a preceding stage and the first receiver circuit 340 in a succeeding stage. Typically, as an isolator, a photocoupler or a transformer is used. Nowadays, as an isolator, a transformer is used that has coils formed on an IC chip and adopted as a primary and a secondary winding of the transformer. In the first embodiment, either of the photocoupler or the transformer can be adopted for the isolator.

A pulse signal, approximately equivalent to the transmission pulse signal Sp, is outputted from an output side of the first signal transfer circuit 330, and is then transferred to an input side of the first receiver circuit 340. From an output side of the first receiver circuit 340, the control output signal Sout obtained by being restored to the control input signal Sin inputted to the signal input terminal 310 is outputted. As a result of restoration, the control output signal Sout having a same waveform and a same phase as the control input signal Sin is outputted to the signal output terminal 350. The transmission pulse generator circuit 320, the first signal transfer circuit 330, and the first receiver circuit 340 together form the main path 34. For a signal transfer circuit of this kind, such the main path 34 is conventionally well-known to the public.

One of the features of the present invention lies in that not only the main path 34 but also the self-diagnosis functional block 38 is provided. The self-diagnosis functional block 38 is formed with: the feedback pulse transmitter circuit 360; the second signal transfer circuit 370; and the second receiver circuit 380. An input signal of the self-diagnosis functional block 38 is the control output signal Sout that is outputted to the signal output terminal 350; the control output signal Sout is inputted to an input side of the feedback pulse transmitter circuit 360 through the signal line 352.

The main path 34 and the self-diagnosis functional block 38 can be divided into the "transmitter side" and the "receiver side" with the first signal transfer circuit 330 and the second signal transfer circuit 370 serving as boundaries therebetween, respectively. Note that such division, if specifically drawn as in this embodiment, leads to increased complexity in the drawings, and thus, the "transmitter side" and the "receiver side" are not specifically drawn in the drawings in the other embodiments which will be described later.

The signal output terminal 350 is connected to a so-called power semiconductor, such as a silicon-carbide (SiC) semiconductor element, IGBT, and MOSFET, in a succeeding stage. The control output signal Sout is used as a drive signal that drives such a power semiconductor as mentioned above.

According to the present invention, the term "self-diagnosis functional block" is used to refer to a block that compares the control input signal Sin and the control output signal Sout so as to find out a difference between the two signals, and that determines whether relevant signal transfer is satisfactory or not. With the self-diagnosis functional block, it is possible not only to detect and monitor, during signal transmission and reception, a state of that signal transmission and reception being performed, including whether or not external noise arrives, but also to detect and diagnose, for a period other than the signal transmission and reception period, whether or not the signal transfer circuit device 300 itself encounters a malfunction.

The control output signal Sout is inputted to the feedback pulse transmitter circuit 360 through the signal line 352. The feedback pulse transmitter circuit 360 generates a feedback pulse signal Sf that is synchronized in phase with the control output signal Sent. The feedback pulse signal Sf is returned to the second receiver circuit 380 via the second signal transfer circuit 370. The control input signal Sin and the feedback pulse signal outputted from the second signal transfer circuit 370 are received by the second receiver circuit 380, where the two signals are compared and whether or not the control output signal Sout is restored faithfully to the control input signal Sin is detected and monitored.

A point to bear in mind when designing a configuration of the self-diagnosis functional block 38 is that for the second signal transfer circuit 370, a same circuit as for the first signal transfer circuit 330 should be used as a main circuit thereof. That is, if the first signal transfer circuit 330 is formed with a photocoupler as its main circuit, the second signal transfer circuit 370 should also be formed with a photocoupler as its main circuit.

Likewise, if a transformer is used as the main circuit of the first signal transfer circuit 330, it is also used as the main circuit of the second signal transfer circuit 370. The control input signal Sin or a signal equivalent thereto is inputted to the second receiver circuit 380 through the signal line 312. The feedback pulse signal Sf outputted from the second signal transfer circuit 370 passes through a waveform-shaping circuit and the like which will be described later, where the feedback pulse signal Sf is shaped into a rectangular waveform signal approximately equivalent to the control input signal Sin, and is then compared with the control input signal Sin by the second receiver circuit 380 so as to derive, from this comparison, a signal indicating that the two signals are "matched" or "unmatched" which is then outputted to the comparison signal output terminal 390. According to the present invention, for example, if the two signals are "matched" or "unmatched," then a signal with accordingly "Low" level or "High" level is outputted to the comparison signal output terminal 390. Needless to say, a polarity of the signal may be reversed so as to represent a comparison result.

The signal thus outputted to the comparison signal output terminal 390 and indicating a comparison "matched" or "unmatched" result is transferred onto the electronic control device 32. Based on that signal, the electronic control device 32 then switches, for example, the power semiconductor 40 from the "on" state to the "off" state, through the signal transfer circuit device 300.

The signal transfer circuit device 300 according to the present invention operates with supply voltage of approximately 5 V. This is true of the other embodiments described later.

For the power semiconductor 40, for example, a silicon-carbide (SiC) semiconductor element, IGBT, MOSFET, or the like is employed, and the power semiconductor 40 drives the motor 50 mounted, for example, in a hybrid automobile.

Second Embodiment

Figure 2:
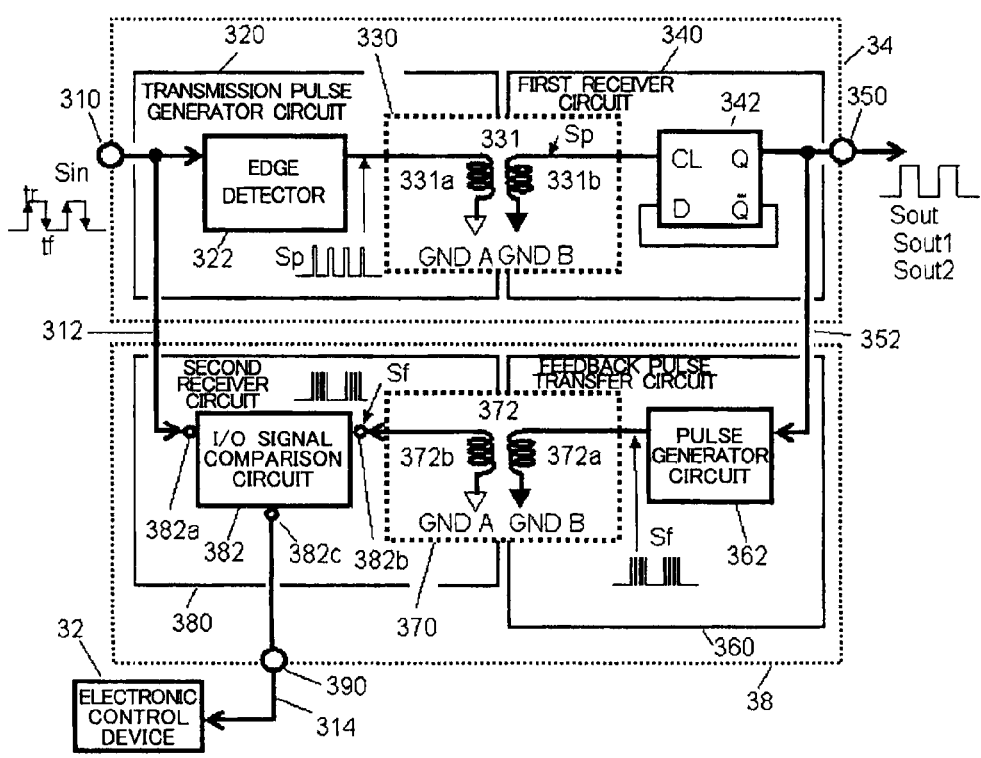
FIG. 2 is a diagram showing a signal transfer circuit device according to a second embodiment of the present invention.

FIG. 2 shows a signal transfer circuit device according to a second embodiment of the present invention. In the figure, same parts as in FIG. 1 can be identified by the same reference symbols. FIG. 2 is a diagram of a specific circuit configuration representing part of FIG. 1.

The signal transfer circuit device 300 shown in FIG. 2 is provided with the signal input terminal 310; the transmission pulse generator circuit 320 is formed with, as its main circuit, an edge detector 322. The edge detector 322 detects not only a rising edge tr of the control input signal Sin but also a falling edge tf thereof. Typically in the edge detector 322, so that power consumption is reduced in the first signal transfer circuit 330 in a succeeding stage, a pulse width of the transmission pulse signal Sp is set smaller than that of the control input signal Sin.

The first signal transfer circuit 330 is formed with, as its main circuit, a transformer 331. A primary winding 331a and a secondary winding 331b of the transformer 331 can be formed on an IC chip. The primary winding 331a and the secondary winding 331b can be so made as to form a multi-layer by being wired with an insulating film in between on the same IC chip. The insulating film has a function of galvanically isolating between the primary winding and the secondary winding. The first signal transfer circuit 330 may be provided with, other than the transformer 331 as its main circuit, an unillustrated buffer and/or amplifier so long as a delay of a signal involved falls within an allowable range; for that, a possibility of causing a delay to a signal involved should be taken into account. The technical idea of forming the primary and secondary windings on an IC chip is suggested by Patent Document 2.

The transformer 331 has the primary winding 331a, of which one end receives the transmission pulse signal Sp, and of which the other end is connected to the first ground potential GND A. The secondary winding 331b is, at one end thereof, connected to an input terminal CL of a D-flipflop 342 in a succeeding stage and is, at the other end thereof, connected to the second ground potential GND B. The D-flipflop 342 is so provided as to serve as a main circuit of the first receiver circuit 340. When a pulse signal approximately equivalent to the transmission pulse signal Sp is inputted to the input terminal CL of the D-flipflop 342, the control output signal Sout that is obtained by being restored to the control input signal Sin is outputted from the output terminal Q of the D-flipflop 342, and is transferred onto the signal output terminal 350. The first receiver circuit 340 may be provided with, other than the D-flipflop 342, an unillustrated waveform-shaping circuit and/or amplifier.

The first and second potential grounds GND A and GND B are galvanically isolated from each other. With this configuration, the transmitter side and the receiver side, namely the transmission pulse generator circuit 320 and the first receiver circuit 340 can be isolated therebetween with sufficiently high resistance and sufficiently high withstand voltage. For example, both the sides can be isolated therebetween with resistance equal to or more than several GΩ and with withstand voltage equal to or more than several hundreds V. Note that the same is true of each transformer which will be described in a third or later embodiments.

Through the signal line 352, the control output signal Sout is inputted to a pulse generator circuit 362, which is a main circuit of the feedback pulse transmitter circuit 360. The pulse generator circuit 362 generates the feedback pulse signal Sf that is synchronized in phase with the control output signal Sout. Timing and a frequency of the feedback pulse signal Sf generated by the pulse generator circuit 362 may be determined so that power consumption is reduced at a feedback transformer 372 in a stage succeeding to the pulse generator circuit 362, and that the feedback pulse signal Sf can be easily compared with the control input signal Sin by the second receiver circuit 380.

In the second embodiment, the timing of the feedback pulse signal Sf is set so that the feedback pulse signal Sf has continuous pulses, for example, during a period when the control output signal Sout remains "High" or during a period when the control output signal Sout remains "Low." Moreover, the feedback pulse signal Sf may be generated during a period when the control output signal Sout remains "Low" only; for that, care should be taken for ease of a signal comparison carried out by the second receiver circuit 380 in the stage succeeding to the feedback transformer 372. When there is no need to consider ease of a signal comparison, the feedback signal Sf has simply to be generated at least either during the period when the control output signal Sout remains "High" or during the period when the control output Sout remains "Low."

The pulse generator circuit 362 may be formed with an oscillator generating a rectangular waveform signal (continuous pulse signal), and an AND circuit for performing an AND operation to obtain a product of an oscillation pulse signal generated by the oscillator multiplied by the control output signal Sout.

The second signal transfer circuit 370 may be provided with, other than the feedback transformer 372, an unillustrated buffer and/or amplifier. The main path 34 is formed with the transmission pulse generator 320, the first signal transfer circuit 330, and the first receiver circuit 340, and needs to realize a delay reduced as much as possible when transferring signals involved therein. This is because the signal processed by the main path 34 is directly fed to the power semiconductor drive circuit. On the other hand, a certain amount of delay is allowed for the signals involved in the self-diagnosis functional block 38 formed with the feedback pulse transmitter circuit 360, the second signal transfer circuit 370, and the second receiver circuit 380. This is because the self-diagnosis functional block 38 is a functional block performing a signal processing for obtaining a so-called self-diagnosis, and thus is not used directly for driving the power semiconductor.

The second receiver circuit 380 is formed with, as its main circuit, an I/O signal comparison circuit 382. The I/O signal comparison circuit 382 may be provided with an exclusive OR circuit and a waveform-shaping circuit. The I/O signal comparison circuit 382 has a first input terminal 382a thereof and a second input terminal 382b thereof, to which the control input signal Sin and the feedback pulse signal Sf are inputted, respectively. The second receiver circuit 380 may be provided with, other than the I/O signal comparison circuit 382, for example, a buffer, an amplifier, a phase delay circuit, various kinds of logic circuits, and the like.

The I/O signal comparison circuit 382 is provided with a waveform-shaping circuit, and the waveform-shaping circuit may be comparatively easily formed with, for example, a switching transistor, current supply, capacitor, inverter, comparator, and the like. The waveform-shaping circuit is provided for shaping the feedback pulse signal Sf outputted from the secondary winding 372b of the feedback transformer 372 into a rectangular waveform signal approximately equivalent to the control input signal Sin. The feedback pulse signal Sf thus shaped into the rectangular waveform signal is then compared, by the I/O signal comparison circuit 382, with the control input signal Sin so as to find out whether they are "matched" or "unmatched." A signal indicating a comparison "matched" or "unmatched" result is then outputted to the comparison signal output terminal 390.

The signal thus outputted to the comparison signal output terminal 390 to indicate a comparison "matched" or "unmatched" result is then transferred onto the electronic control device 32 through the signal line 314. Based on that signal, the electronic control device 32 can control the signal transfer circuit device 300.

Figure 3:
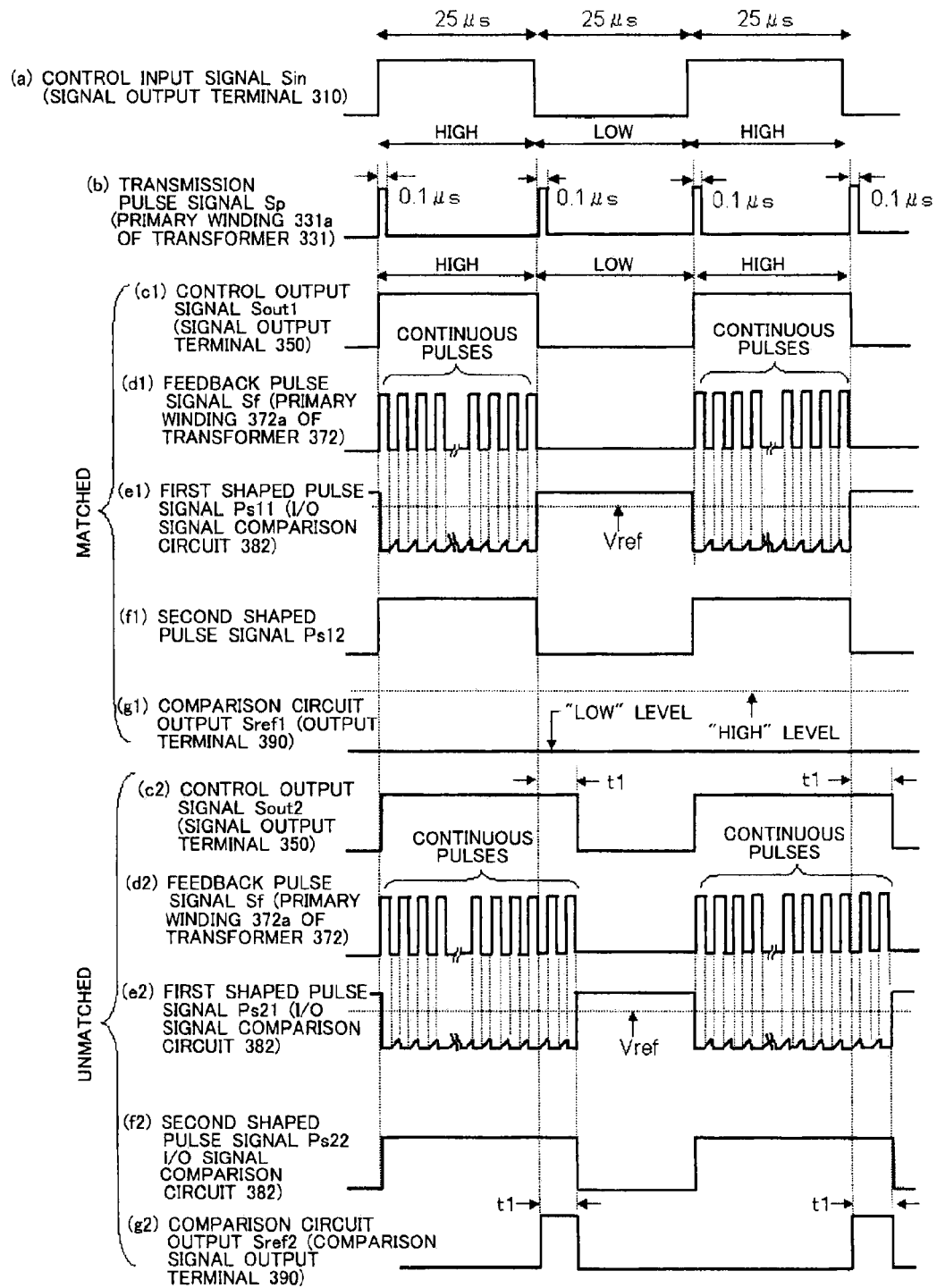
FIG. 3 is a timing chart illustrating pulse signals of different parts of the second embodiment of the present invention shown in FIG. 2.

FIG. 3 is a timing chart illustrating signals of parts, shown in FIG. 2, of this embodiment. FIGS. 3(a), (b), (c1), (d1), (e1), (f1), and (g1) schematically illustrate a case where the control output signal Sout is restored faithfully to the control input signal Sin, namely a case where the control output signal Sout and the control input signal Sin are "matched." On the other hand, FIGS. 3(a), (b), (c2), (d2), (e2), (f2), and (g2) schematically illustrate a case where there is a period when the control output signal Sout and the control input signal Sin are "unmatched." It should be understood that such a signal as described above is susceptible to a certain change in its waveform, phase, or delay in phase, which is ignored in the specification and the drawings herein.

FIG. 3(a) represents the control input signal Sin inputted to the signal input terminal 310. The control input signal Sin is processed, for example, as the drive signal for the power semiconductor and the motor. For the convenience of the drawing, the control input signal Sin exhibits a duty ratio of 50% with pulse widths corresponding to its "High" and "Low" periods equally 25 □s. In a case where the drive signal for the power semiconductor and the motor has undergone pulse width modulation (PWM), the duty ratio of the control input signal Sin is varied over time.

FIG. 3(b) represents the transmission pulse signal Sp outputted from the edge detector 322. The transmission pulse signal Sp is then inputted to the primary winding 331a of the transformer 331. From the secondary winding 331b, the pulse signal approximately equivalent to the transmission pulse signal Sp is outputted. The transmission pulse signal Sp has its pulse width set to, for example, 0.1 □s, sufficiently smaller than 25 □s of the control input signal Sin.

FIG. 3(c1) represents the control output signal Sout 1 outputted to the output terminal Q of the D-flipflop 342 and to the signal output terminal 350. The D-flipflop 342 is so used as to restore the signal inputted to the input terminal CL thereof, to the control input signal Sin. Note that, despite the fact that the control output signal Sout1 and the control input signal Sin are actually different from each other in waveform and phase, the control output signal Sout1 and the control input signal Sin are drawn to be equivalent in the figure for the sake of convenience of the drawings and descriptions. The signal output terminal 350 is, in its succeeding stage, connected to the power semiconductor that is driven by the signal transfer circuit as described above.

FIG. 3(d1) represents the feedback pulse signal Sf that is generated by the pulse generator circuit 362 if the control output signal Sout1 is matched with the control input signal Sin. That is, the feedback pulse signal Sf shown in FIG. 3(d1) has its timing set so that the feedback pulse signal Sf is synchronized in phase with the control output signal Sout1, and that continuous pulses are generated during a period when the control output signal Sout1 remains "High" only. Needless to say, the feedback pulse signal Sf may be generated during a period when the control output signal Sout1 remains "Low" only. Whatever the case may be, how to generate the feedback pulse signal Sf depends on power consumption of the second signal transfer circuit 370 in the succeeding stage, and on a circuit configuration of the second receiver circuit 380. Moreover, a pulse width and a frequency of the feedback pulse signal Sf may be set to, for example, 0.1 □s and f=2 MHz, respectively. A duty ratio of the feedback pulse signal Sf is set to, for example, 20%. Needless to say, values of the magnitude and the frequency of that signal are not limited to those mentioned above, and may be determined in accordance with power consumed by the feedback transformer 372, and a function and a circuit configuration of the I/O signal comparison circuit 382, etc. Note that the feedback pulse signal Sf is transferred to the primary and secondary windings 372a and 372b of the feedback transformer 372.

FIG. 3(e1) represents a first shaped pulse signal Ps11 generated by making the feedback pulse signal Sf shown in FIG. 3(d1) pass through a first pulse waveform-shaping circuit provided in the I/O signal comparison circuit 382 serving as the main circuit of the second receiver circuit 380, where by the first pulse waveform-shaping circuit, the feedback pulse signal Sf is shaped into the first shaped pulse signal Ps11. The first shaped pulse signal Ps11 is then shaped in line with a reference potential Vref so as to generate a second shaped pulse signal Ps12 which will be described later. A circuit configuration of the I/O signal comparison circuit 382 will be specifically described later.

FIG. 3(f1) represents a second shaped pulse signal Ps12 generated by making the first shaped pulse signal Ps11 shown in FIG. 3(e1) pass through the second pulse waveform-shaping circuit provided in the I/O signal comparison circuit 382, where by the second pulse waveform-shaping circuit, the first shaped pulse signal Ps11 is shaped into the second shaped pulse signal Ps12. The second shaped pulse signal Ps12 is inputted to a second input terminal of the exclusive OR circuit provided in the later described I/O signal comparison circuit 382. To that first input terminal, the control input signal Sin is inputted.

FIG. 3(g1) represents a comparison circuit output Sref1 indicating that an output of the exclusive OR circuit provided in the I/O signal comparison circuit 382 is "Low" level. If the control input signal Sin shown in FIG. 3(a) and the second shaped pulse signal Ps12 shown in FIG. 3(f1) are inputted to a first and the second input terminal of the exclusive OR circuit, respectively, the output of the exclusive OR circuit is "Low" level. That is, FIG. 3(g1) represents a state where the control output signal Sout1 is restored faithfully to the control input signal Sin, namely a state where the two signals are "matched." Note that an inverter may be provided in a stage succeeding to the output of the exclusive OR circuit so as to reverse a polarity of the signal to be outputted from the exclusive OR circuit.

Next, a case where the two signals, namely the control output signal Sout2 and the control input signal Sin are "unmatched" will be described. FIGS. 3(a), (b), (c2), (d2), (e2), (f2), and (g2) schematically illustrate a case where the control output signal Sout2 is not restored faithfully to the control input signal Sin, namely a case where the two signals are "unmatched." Note that if there is a period when the two signals are "unmatched," the signal transfer circuit device 300 is subject to certain control from the electronic control device 32. As described earlier in the first embodiment, the signal transfer circuit device 300 is subject to certain control from the electronic control device 32. The signals represented by FIGS. 3(*a*) and (*b*) are same regardless of whether the two signals are "matched" or "unmatched," and thus, no overlapping description on them will be given.

FIG. 3(*c*2) schematically illustrates the control output signal Sout2 that is not restored faithfully to the control input signal Sin, and that is outputted to the signal output terminal 350. That is, the control output signal Sout2, as a result of restoration, has its pulse width larger, increased by t1, than a normal width obtained when the control output signal Sout2 is restored faithfully. Even in a case where the two signals are determined to be "matched," typically a control output signal outputted to the signal output terminal 350 is delayed in phase, and is slightly different in waveform compared with the control input signal Sin. However, the control output signal Sout2 shown in FIG. 3(*c*2) deviates greatly from such an allowable range, and thus is considered as "unmatched" when compared with the control input signal Sin. A waveform of the control output signal Sout2 that is considered to be "unmatched" when compared with control input signal Sin is not limited to that shown in FIG. 3(*c*2).

FIG. 3(*d*2) represents the feedback pulse signal Sf generated by the pulse generator circuit 362 and outputted to the primary and secondary windings 372*a* and 372*b* of the feedback transformer 372. The feedback pulse signal Sf is present during the period when the control input signal Sin remains "High", and is extended to part of the period when the control input signal Sin is "Low". Such a state as described above should be considered as "unmatched" as a result of comparison between the two signals.

FIG. 3(*e*2) represents the first shaped pulse signal Ps21 generated by making the feedback pulse signal Sf shown in FIG. 3(*d*2) pass through the first pulse waveform-shaping circuit provided in the I/O signal comparison circuit 382 serving as the main circuit of the second receiver circuit 380, where by the first pulse waveform-shaping circuit, the feedback pulse signal Sf is shaped into the first shaped pulse signal Ps21. The first shaped pulse Ps21 is shaped in line with the reference potential Vref so as to generate a second shaped pulse signal Ps22 which will be described later.

FIG. 3(*f*2) represents a second shaped pulse signal Ps22 generated by making the first shaped pulse signal Ps21 shown in FIG. 3(*e*) pass through the second pulse waveform-shaping circuit provided in the I/O signal comparison circuit 382, where by the second pulse waveform-shaping circuit, the first shaped pulse signal Ps21 is shaped into the second shaped pulse signal Ps22.

FIG. 3(*g*2) represents a comparison circuit output Sref2 that is an output of the exclusive OR circuit provided in the I/O signal comparison circuit 382, namely a signal outputted from the comparison signal output terminal 390 and indicating "High" level. That is, the control output signal Sout2 is not restored faithfully to the control input signal Sin, and thus is processed so that the two signals are determined to be "unmatched." Note that an inverter is provided in a stage succeeding to the output of the exclusive OR circuit so as to reverse a polarity of the signal to be outputted from the exclusive OR circuit. If the control input signal Sin shown in FIG. 3(*a*) and the second shaped pulse signal Ps22 shown in FIG. 3(*f*2) are inputted to the first and second input terminals of the exclusive OR circuit, the output of the exclusive OR circuit becomes "High" level during the period t1 so as to represent "unmatched." Needless to say, a polarity of the comparison circuit output Sref2 may be reversed.

Third Embodiment

Figure 4:
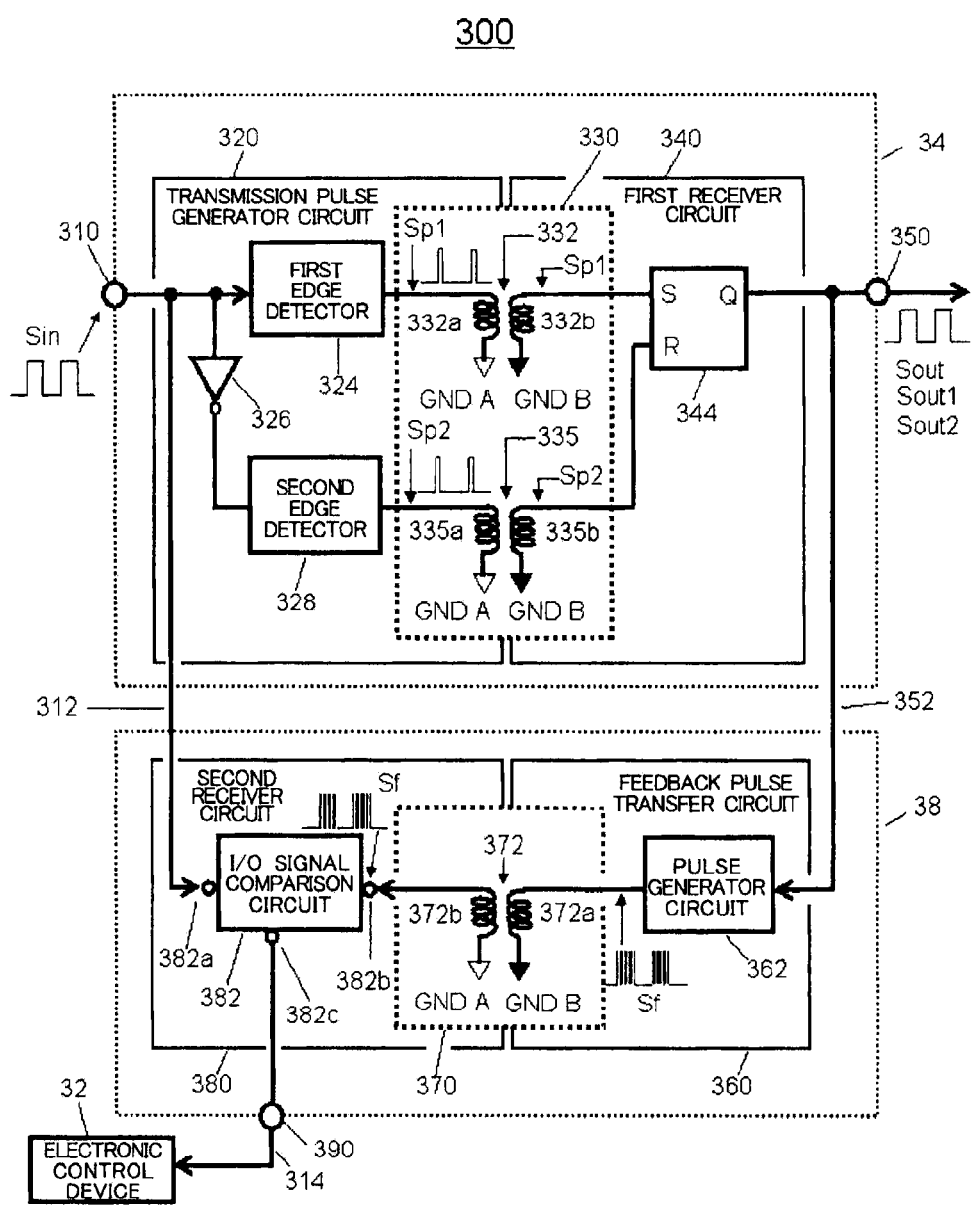
FIG. 4 is a diagram showing a signal transfer circuit device according to a third embodiment of the present invention.

FIG. 4 shows a signal transfer circuit device according to a third embodiment of the present invention. In this figure, same parts as in FIGS. 1 and 2 can be identified by the same reference symbols. In the second embodiment, the main path 34 and the self-diagnosis functional block 38 each employs one transformer alone. On the other hand, the third embodiment describes a case where the main path 34 employs two transformers and the self-diagnosis functional block 38 employs one transformer.

The signal transfer circuit device 300 shown in FIG. 4 is provided with the signal input terminal 310, and a transmission pulse generator circuit 320 is provided with: a first edge detector 324; an inverter 326; and a second edge detector 328. The first and second edge detectors 324 and 328 are so provided as to serve as main circuits of the transmission pulse generator circuit 320. The transmission pulse generator circuit 320 may be provided with, other than the two edge detectors, an unillustrated buffer, amplifier, or the like.

The first edge detector 324 detects a rising edge of the control input signal Sin, and then generates the first transmission pulse signal Sp1. Moreover, the control input signal Sin is inputted to the second edge detector 328, where a polarity of the control input signal Sin is reversed by use of an inverter 326. Thus, the second edge detector 328 detects a falling edge of the control input signal Sin, and then generates and outputs therefrom the second transmission pulse signal Sp2 in synchronization with that falling edge of the control input signal Sin.

The first signal transfer circuit 330 has, as its main circuits, a first transformer 332 and a second transformer 335. The first signal transfer circuit 330 may be provided with an unillustrated buffer and/or amplifier. The first transformer 332 has a primary winding 332*a*, of which one end receives the first transmission pulse signal Sp1, and of which the other end is connected to a first ground potential (GND A). The first transformer 332 has a secondary winding 332*b*, of which one end is connected to a set terminal S of an RS-flipflop 334 which will be described later, and of which the other end is connected to a second ground potential (GND B). From the secondary winding 332*b* of the first transformer 332, a pulse signal approximately equivalent to the first transmission pulse signal Sp1 is outputted. In the first transformer 332, the primary winding 332*a* and the secondary winding 332*b* are connected to the ground potentials provided separately from each other, and thus remain in a state being sufficiently and galvanically isolated from each other.

The first receiver circuit 340 is formed with, as its main circuit, the RS-flipflop 344. The first receiver circuit 340 may be provided with, other than the RS-flipflop 344, for example a buffer and/or amplifier; for that, the more stages are added, the more care should be taken for a signal delay. The RS-flipflop 344 has a set terminal S thereof and a reset terminal R thereof, to which transmission pulse signals approximately equivalent to the first transmission pulse signal Sp1 and the second transmission pulse signal Sp2 are inputted, respectively. As described above, the first transmission pulse signal Sp1 and the second transmission pulse signal Sp2 are pulses signals generated by detecting the rising edge and the falling edge of the control input signal Sin. In this way, the RS-flipflop 344 outputs, from its output terminal Q, the control output signal Sout whose waveform and phase are restored to the control input signal Sin. The control output signal Sout is then outputted to the signal output terminal 350. As described earlier, the signal output terminal 350 is connected to the so-called power semiconductor in a succeeding stage, such as a silicon-carbide (SiC) semiconductor element, IGBT, and MOSFET.

The feedback pulse transmitter circuit 360 is formed with, as its main circuit, a pulse generator circuit 362. To the pulse generator circuit 362, the control output signal Sout is inputted through a signal line 352. The feedback pulse transmitter circuit 360 may be provided with, other than the pulse generator circuit 362, a buffer, amplifier, or the like. The pulse generator 362 generates a feedback pulse signal Sf that is synchronized in phase with the control output signal Sout. Needless to say, the control output signal Sout is a signal obtained by being restored to the control input signal Sin, and thus, the feedback pulse signal Sf is synchronized in phase with the control input signal Sin.

The pulse generator circuit 362 may be formed with an oscillator generating, for example, a rectangular waveform signal (continuous pulse signal); and an AND circuit for performing an AND operation to obtain a product of an oscillation pulse signal generated by the oscillator multiplied by the control output signal Sout.

The second signal transfer circuit 370 may be provided with, other than the feedback transformer 372, an unillustrated buffer, amplifier, or the like. The main path 34 is formed with the transmission pulse generator circuit 320, the first signal transfer circuit 330, and the first receiver circuit 340, and needs to realize a delay reduced as much as possible when transferring signals involved therein. This is because the signals processed by the main path 34 are directly fed to a drive circuit of the power semiconductor. On the other hand, a certain amount of delay is allowed for the signals involved in the self-diagnosis functional block 38 formed with the feedback pulse transmitter circuit 360, the second signal transfer circuit 370, and the second receiver circuit 380. This is because the self-diagnosis functional block 38 is a functional block performing a signal processing for obtaining a so-called self-diagnosis, and thus is not used directly for driving the power semiconductor.

The second receiver circuit 380 is formed with, as its main circuit, an I/O signal comparison circuit 382. The I/O signal comparison circuit 382 may be provided with, other than an exclusive OR circuit, a waveform-shaping circuit. The I/O signal comparison circuit 382 has a first input terminal 382a thereof and a second input terminal 382b thereof, to which the control input signal Sin and the feedback pulse signal Sf are inputted, respectively. The I/O signal comparison circuit 382 has an output terminal 382c thereof, from which a signal indicating that, as a result of comparison, the control input signal Sin and the rectangular waveform signal obtained by performing waveform-shaping on the feedback pulse signal Sf are "matched" or "unmatched" is outputted. The output terminal 382c is connected to the comparison signal output terminal 390. Note that the second receiver circuit 380 may be provided with, other than the I/O signal comparison circuit 382, for example a buffer, an amplifier, a phase delay circuit, various kinds of logic circuits, and the like.

The I/O signal comparison circuit 382 is provided with a waveform-shaping circuit, and the waveform-shaping circuit may be comparatively easily formed with, for example, a switching transistor, a current supply, a capacitor, an inverter, a comparator, and the like. The waveform-shaping circuit shapes the feedback pulse signal Sf outputted to the secondary winding 372b of the feedback transformer 372 into a rectangular waveform signal approximately equivalent to the control input signal Sin. The feedback pulse signal Sf so shaped into the rectangular waveform signal is then compared, by the I/O signal comparison circuit 382, with the control input signal Sin so as to find out whether they are "matched" or "unmatched." As a result of comparison, a signal indicating a "matched" or "unmatched" result is outputted to the comparison signal output terminal 390.

The signal thus outputted to the comparison signal output terminal 390 to indicate a comparison "matched" or "unmatched" result is then transferred onto the electronic control device 32 through the signal line 314. Based on that signal, the electronic control device 32 can control the signal transfer circuit device 300.

When the feedback pulse signal Sf is inputted to the primary winding 372a of the feedback transformer 372, a feedback pulse signal approximately equivalent to that feed back pulse signal Sf is outputted from the secondary winding 372b. The resulting feedback pulse signal is then inputted to the second input terminal 382b of the I/O signal comparison circuit 382. To the first input terminal 382a, the signal approximately equivalent to the control input signal Sin is inputted through the signal line 312.

Figure 5:
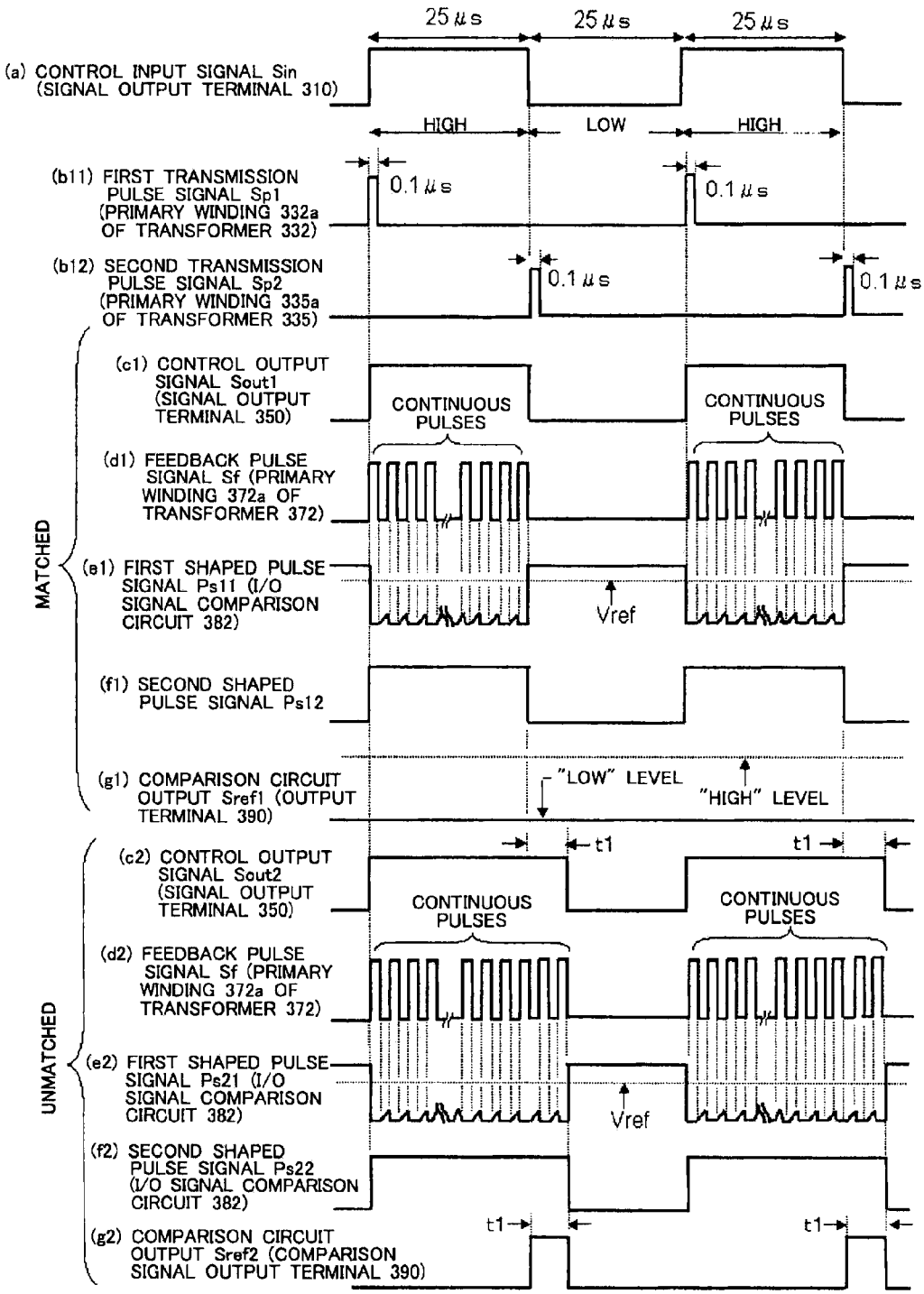
FIG. 5 is a timing chart illustrating pulse signals of different parts of the third embodiment of the present invention shown in FIG. 4.

FIG. 5 is a timing chart illustrating signals of parts, shown in FIG. 4, of this embodiment. FIGS. 5(a), (b11), (b12), (c1), (d1), (e1), (f1), and (g1) schematically illustrate a case where the control output signal Sout is restored faithfully to the control input signal Sin, namely a case where the control output signal Sent and the control input signal Sin are "matched." On the other hand, FIGS. 5(a), (b11), (b12), (c2), (d2), (e2), (f2), and (g2) schematically illustrate a case where there is a period when the control output signal Sout and the control input signal Sin are "unmatched." The signals represented by FIGS. 5(a), (b11), and (b12) are same regardless of whether the two signals are "matched" or "unmatched." Note that waveforms shown in FIG. 5 are basically the same as shown in FIG. 3.

The control input signal Sin shown in FIG. 5(a) is inputted to the signal input terminal 310. The control input signal Sin is used, for example, as a drive signal for the power semiconductor and the motor. The control input signal Sin has its duty ratio of 50% with "High" and "Low" periods of 25 □s for each. In a case where the drive signal for the motor has undergone pulse width modulation (PWM), the duty ratio of the control input signal Sin is varied over time.

FIG. 5(b11) represents the first transmission pulse signal Sp1 outputted from the first edge detector 324, and inputted to the primary winding 332a of the first transformer 332. A pulse signal approximately equivalent to the first transmission pulse signal Sp1 is then outputted from the secondary winging 332b of the first transformer 332. The first transmission pulse signal Sp1 has its pulse width set to, for example, 0.1 □s, sufficiently smaller than 25 □s of the control input signal Sin.

FIG. 5(b12) represents the second transmission pulse signal Sp2 that is outputted from the second edge detector 328, and that is then inputted to the primary winding 335a of the second transformer 335. From the secondary winding 335b of the second transformer 335, a pulse signal approximately equivalent to the second transmission pulse signal Sp2 is outputted. The second transmission pulse signal Sp2 has its pulse width set to 0.1 □s, equal to 0.1 □s of the first transmission pulse signal Sp1.

The pulse signals approximately equivalent to the first and second transmission pulse signals Sp1 and Sp2 are inputted to the set terminal S and the reset terminal R of the RS-flipflop 344, respectively.

FIG. 5(c1) represents the control output signal Sout1 that is outputted from the output terminal Q of the RS-flipflop 344, and that is then sent onto the signal output terminal 350. The RS-flipflop 344 is provided for reproducing the control output signal Sout1 based on the control input signal Sin.

The control output signal Sout1 is inputted to the pulse generator circuit 362, which is a main circuit of the feedback pulse transmitter circuit 360, through the signal line 352. The pulse generator circuit 362 generates the feedback pulse signal Sf that is synchronized in phase with the control output signal Sout1. Timing and a frequency of the feedback pulse signal Sf generated by the pulse generator circuit 362 are determined in consideration of reducing power consumption of the feedback transformer 372, which is a main circuit of the second signal transfer circuit 370 in a stage succeeding to the pulse generator circuit 362, and a circuit configuration of the second receiver circuit 380. The feedback pulse signal Sf generated by the pulse generator circuit 362 is inputted to the primary winding 372a of the feedback transformer 372.

FIG. 5(d1) represents the feedback pulse signal Sf having its timing set so that the feedback pulse signal Sf is synchronized in phase with the control output signal Sout1, and that continuous pulses are generated during a period when the control output signal Sout remains "High." Needless to say, the feedback pulse signal Sf may be generated during a period when the control output signal Sout remains "Low" only. Whatever the case may be, how to generate the feedback pulse signal Sf depends on power consumption of the second signal transfer circuit 370 in a succeeding stage, and on a circuit configuration of the second receiver circuit 380. Moreover, a pulse width and a frequency of the feedback pulse signal Sf may be set to, for example, 0.1 □s and f=2 MHz, respectively. A duty ratio of the feedback pulse signal Sf is set to, for example, 20%. Needless to say, values of the magnitude and the frequency of that signal are not limited to those mentioned above, and may be determined in accordance with power consumed by the feedback transformer 372 in a succeeding stage, a function and a circuit configuration of the I/O signal comparison circuit 382, etc.

When the feedback pulse signal Sf shown in FIG. 5(d1) is inputted to the primary winding 372a of the feedback transformer 372, the pulse signal approximately equivalent to the feedback pulse signal Sf is inputted to the second input terminal 382b of the I/O signal comparison circuit 382 via the secondary winding 372b. To the first input terminal 382a of the I/O signal comparison circuit 382, the control input signal Sin or a signal equivalent to the control input signal Sin is inputted through the signal line 312.

FIG. 5(e1) represents the first shaped pulse signal Ps11 generated by making the feedback pulse signal Sf shown in FIG. 5(d1) pass through the first pulse waveform-shaping circuit provided in the I/O signal comparison circuit 382, which is a main circuit of the second receiver circuit 380, where by the first pulse waveform-shaping circuit, the feedback pulse signal Sf is shaped into the first shaped pulse signal Ps11. The first shaped pulse signal Ps11 is then shaped in line with the reference potential Vref so as to generate a second shaped pulse signal Ps22 which will be described later. A circuit configuration of the I/O signal comparison circuit 382 will be specifically described later.

FIG. 5(f1) represents the second shaped pulse signal Ps12 generated by making the first shaped pulse signal Ps11 pass through the second pulse waveform-shaping circuit provided in the I/O signal comparison circuit 382, where by the second pulse waveform-shaping circuit, the first shaped pulse signal Ps11 is shaped into the second shaped pulse signal Ps12. The second shaped pulse signal Ps12 is then inputted to the second input terminal of the exclusive OR circuit provided in the I/O signal comparison circuit 382 which will be described later. To the first input terminal of the exclusive OR circuit, the control input signal Sin is inputted.

FIG. 5(g1) represents a comparison circuit output Sref1 indicating that an output of the exclusive OR circuit provided in the I/O signal comparison circuit 382 is "Low" level. The output of the exclusive OR circuit is transferred onto the comparison signal output terminal 390. Note that an inverter may be provided in a stage succeeding to the output of the exclusive OR circuit so as to reverse a polarity of the signal to be outputted from the exclusive OR circuit. If the control input signal Sin shown in FIG. 5(a) and the second shaped pulse signal Ps12 shown in FIG. 5(f1) are inputted to the first and second input terminals of the exclusive OR circuit, respectively, the output of the exclusive OR circuit is "Low" level. Needless to say, the comparison circuit output Sref1 may be outputted at "High" level. FIG. 5(g1) depicts a state where the control output signal Sout1 is restored faithfully to the control input signal Sin, namely a state where the two signals are "matched."

Next, a case where the two signals are "unmatched" will be described. FIGS. 5(a), (b11), (b12), (c1), (d2), (e2), (f2), and (g2) schematically illustrates signals of parts if the control output signal Sout2 is not restored faithfully to the control input signal Sin, namely if the two signals are "unmatched." Typically, the signal transfer circuit device 300 is so set as to be subject to certain control from the electronic control device 32 if the two signals are "unmatched" as described in the second embodiment. The signals represented by FIGS. 5(a), (b11), and (b12) are same regardless of whether the two signals are "matched" or "unmatched," and thus, no overlapping description on them will be given.

FIG. 5(c2) represents the control output signal Sout2 that is not restored faithfully to the control input signal Sin, and that is then outputted to the signal output terminal 350. That is, the control output signal Sout2 has its pulse width larger, increased by t1, than a normal width of the control output signal Sout2 obtained when restored faithfully to the control input signal Sin.

Such a state as described above is considered as "unmatched" as a result of comparison between the two signals. Even in a case where the two signals are "matched," typically the control output signal is delayed in phase and is slightly different in waveform from the control input signal Sin. However, the control output signal Sout2 shown in FIG. 5(c2) deviates from such an allowable range, and thus is considered as "unmatched" with the control input signal Sin.

FIG. 5(d2) represents the feedback pulse signal Sf generated by the pulse generator circuit 362 and then outputted to the primary and secondary windings 372a and 372b of the feedback transformer 372. The feedback pulse signal Sf is present during a period when the control output signal Sout2 shown in FIG. 5(c2) remains "High." It can be found from FIG. 5 that the feedback pulse signal Sf is present not only for the "High" period of the control input signal Sin but also for part of the "Low" period thereof. Such a state as described above is considered to represent the two signals are "unmatched."

FIG. 5(e2) represents the fist shaped pulse signal Ps21 generated by making the feedback pulse signal Sf shown in FIG. 5(d2) pass through the first pulse waveform-shaping circuit provided in the I/O signal comparison circuit 382, which is a main circuit of the second receiver circuit 380, where by the first pulse waveform-shaping circuit, the feedback pulse signal Sf is shaped into the first shaped pulse signal Ps21. The first shaped pulse signal Ps21 is then compared with the reference potential Vref so as to generate a second shaped pulse signal Ps22 which will be described later.

FIG. 5(f2) represents the second shaped pulse signal Ps22 generated by making the first shaped pulse signal Ps21 pass through the second pulse waveform-shaping circuit provided in the I/O signal comparison circuit 382, where by the second pulse waveform-shaping circuit, the first shaped pulse signal Ps21 is shaped into the second shaped pulse signal Ps22.

FIG. 5(g2) represents a comparison circuit output Sref2 that is an output of the exclusive OR circuit provided in the I/O signal comparison circuit 382, namely a signal outputted to the comparison signal output terminal 390 and indicating "High" level. Note that an inverter may be provided in a stage succeeding to the output of the exclusive OR circuit so as to reverse a polarity of the signal. FIG. 5(g2) shows the control output signal Sout2 that is not restored faithfully to the control input signal Sin, and that is then outputted as a signal considered as "unmatched" with the control input signal Sin. If the control input signal Sin shown in FIG. 5(a) and the second shaped pulse signal Ps22 shown in FIG. 5(f2) are inputted to the first and second input terminals of the exclusive OR circuit, respectively, the exclusive OR circuit outputs "High" level for a period t1 to represent the two signals are "unmatched." Note that a polarity of the output shown in FIG. 5(g2) may be reversed.

Fourth Embodiment

Figure 6:
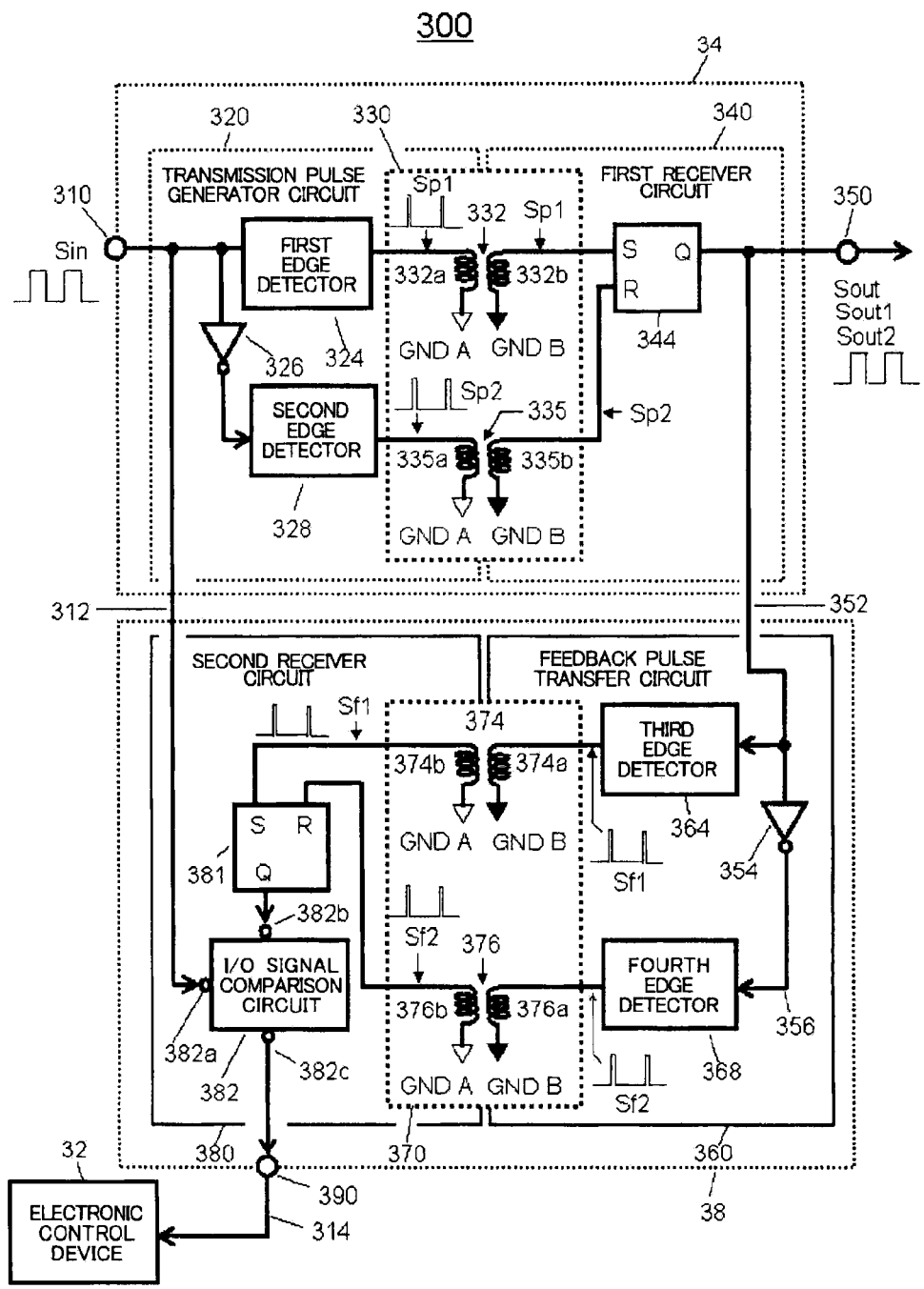
FIG. 6 is a diagram showing a signal transfer circuit device according to a fourth embodiment of the present invention.

FIG. 6 shows a signal transfer circuit device according to a fourth embodiment of the present invention. In this figure, same parts as in FIGS. 1, 2, and 4 can be identified by the same reference symbols. In the third embodiment, the main path 34 employs two transformers, and the self-diagnosis functional block 38 employs one transformer. The fourth embodiment is characterized in that the main path 34 and the self-diagnosis functional block 38 each employ two transformers. In the fourth embodiment, the self-diagnosis functional block 38 adopts a circuit different from that of the third embodiment is adopted, whereas the main path 34 may adopt a same circuit as in the third embodiment.

The signal transfer circuit device 300 shown in FIG. 6 is provided with the signal input terminal 310, and the transmission pulse generator circuit 320 is provided with the first edge detector 324, the inverter 326, and the second edge detector 328. The first and second edge detectors 324 and 328 are so provided as to serve as main circuits of the transmission pulse generator circuit 320. The first edge generator 324 detects a rising edge of the control input signal Sin, and then generates the first transmission pulse signal Sp1. Moreover, the control input signal Sin passes through the inverter 326, where a polarity of the control input signal Sin is reversed, and is then inputted to the second edge detector 328. Thus, the second edge detector 328 detects a falling edge of the control input signal Sin, and then generates and outputs therefrom the second transmission pulse signal Sp2 in synchronization with that falling edge of the control input signal Sin.

The first signal transfer circuit 330 has, as its main circuits, the first transformer 332 and the second transformer 335. The first signal transfer circuit 330 may be provided with an unillustrated buffer and/or amplifier. The first transformer 332 has a primary winding 332a, of which one end receives the first transmission pulse signal Sp1, and of which the other end is connected to a first ground potential (GND A). The first transformer 332 has a secondary winding 332b, of which one end is connected to a set terminal S of an RS-flipflop 344 which will be described later, and of which the other end is connected to a second ground potential (GND B). From the secondary winding 332b of the first transformer, a pulse signal approximately equivalent to the first transmission pulse signal Sp1 is outputted. The primary and secondary windings 332a and 332b of the first transformer 332 are individually connected to the ground potentials provided separately from each other, and thus remain in a state being sufficiently and galvanically isolated from each other. The two windings can be considered to be connected with extremely high resistance equal to or more than several GΩ. Moreover, a breakdown voltage, behaving like a dc voltage, between the two windings exceeds several hundreds V.

The first receiver circuit 340 is formed with, as its main circuit, the RS-flipflop 344. The first receiver circuit 344 may be provided with, other than the RS-flipflop 344, an unillustrated buffer and/or amplifier; for that, the more stages are added, the more care should be taken for a signal delay. The RS-flipflop 344 has a set terminal S thereof and a reset terminal R thereof, to which transmission pulse signals approximately equivalent to the first transmission pulse signal Sp1 and the second transmission pulse signal Sp2 are inputted, respectively. As described above, the first and second transmission pulse signals Sp1 and Sp2 are pulse signals generated by detecting the rising and falling edges of the control input signal Sin, respectively. In this way, the RS-flipflop 344 outputs, from its output terminal Q, the control output signal Sout whose form and position are restored to the control input signal Sin. The control output signal Sout is outputted to the signal output terminal 350.

The feedback pulse transmitter circuit 360 has, as it main circuits, a third edge detector 364 and a fourth edge detector 368. The control output signal Sout is inputted to the third edge detector 364 through the line signal 352, and is inputted to the fourth edge detector 368 through the signal line 352, the inverter 354, and the signal line 356. Basically, the third and fourth edge detectors 364 and 368 function for a same purpose as the first and second edge detectors 324 and 328, which are main circuits of the transmission pulse generator circuit 320, do.

In the above-described second and third embodiments, the pulse generator circuit 362 is provided on a transmitter side of the self-diagnosis functional block 38. On the other hand, the fourth embodiment is characterized in that the third and fourth edge detectors 364 and 368 are so provided as to take a place of the pulse generator circuit 362.

The third edge detector 364 is synchronized with the control output signal Sout, detects a rising edge of the control output signal Sout, and then generates the first feedback pulse signal Sf1. The fourth edge detector 368 is synchronized with the control output signal Sout, detects a falling edge of the control output signal Sent, and then generates the second feedback pulse signal Sf2. The third and fourth edge detector 364 and 368 are synchronized with the control output signal Sout, which is obtained by being restored to the control input signal Sin; thus, the first feedback pulse signal Sf1 is approximately equivalent to the first transmission pulse signal Sp1 generated by the first edge detector 324, and the second feedback pulse signal Sf2 is approximately equivalent to the second transmission pulse signal Sp2 generated by the second edge detector 328.

The feedback pulse transmitter circuit may be provided with, other than the third and fourth edge detectors 364 and 368, an unillustrated buffer, amplifier and the like.

The second signal transfer circuit 370 is provided with two main circuits, namely the first feedback transformer 374 and the feedback transformer 376. Although the fourth embodiment is characterized by employing two feedback transformers as described above, an unillustrated buffer, amplifier, or the like may be added to these main circuits.

The first feedback transformer 374 has a primary winding 374a, of which one end receives the first transmission pulse signal Sf1, and of which the other end is connected to a second ground potential (GND B). The first feedback transformer 374 has a secondary winding 374b, of which one end outputs a pulse signal approximately equivalent to the first feedback pulse signal Sf1, and of which the other end is connected to a first ground potential (GND A). The ground potentials of the primary and secondary windings of the first feedback transformer 374 are separate from each other and galvanically isolated from each other, making it possible to eliminate unwanted interference and unexpected occurrence of a malfunction before they emerge in practice.

The second feedback transformer 376 has a primary winding 376a, of which one end receives the second feedback pulse signal Sf2, and of which the other end is connected to a second ground potential (GND B). The second feedback transformer 376 has a secondary winding 376b, of which one end outputs a pulse signal approximately equivalent to the second feedback pulse signal Sf2. The ground potentials of the primary and secondary windings of the second feedback transformer 376 are separate from each other, and thus are galvanically isolated from each other. With this, it is possible to eliminate unwanted interference.

The second receiver circuit 380 has, as its main circuits, an RS-flipflop 381 and an I/O signal comparison circuit 382. The RS-flipflop 381 has a set terminal S thereof connected to one end of the secondary winding 374b of the first feedback transformer 374, and thus receiving a feedback pulse signal approximately equivalent to the first feedback pulse signal Sf1. The RS-flipflop 381 has a reset terminal R thereof connected to one end of the secondary winding 376b of the second feedback transformer 376, and thus receiving a feedback pulse signal approximately equivalent to the second feedback pulse signal Sf2.

The RS-flipflop 381 has an output terminal Q thereof, from which a signal that is set by the first feedback pulse signal Sf1 and that is reset by the second feedback pulse signal Sf2 is outputted. That signal, when its signal delay is ignored, is approximately equivalent to the control output signal Sout outputted to the signal output terminal 350. That is, the control output signal Sout, when its signal delay is ignored, is approximately equivalent to the control input signal Sin. Thus, from the output terminal Q of the RS-flipflop 381, a rectangular waveform signal approximately equivalent to the control input signal Sin is outputted.

In the fourth embodiment, unlike in the second and third embodiments, signals inputted to the first and second input terminals 382a and 382b of the I/O signal comparison circuit 382 are approximately equivalent to each other. Thus, according to the fourth embodiment, it is possible to make a circuit configuration of the I/O signal comparison circuit 382 simple compared with other embodiments. For example, with the exclusive OR circuit alone, it is possible to achieve a function of comparing signals. For better implementation of a function assigned to that circuit, however, it is preferable that a signal delay circuit for matching phases of the two signals to be compared and a waveform-shaping circuit for performing waveform-shaping be provided. This makes it possible to further improve the function of comparing input and output signals. The waveform-shaping circuit, as described earlier, can be comparatively easily formed with, for example, a switching transistor, a current source, a capacitor, an inverter, a comparator, and the like. A result of comparison performed by the I/O signal comparison circuit 382 is outputted to the output terminal 382c, and is then transferred onto the comparison signal output terminal 390.

Figure 7:
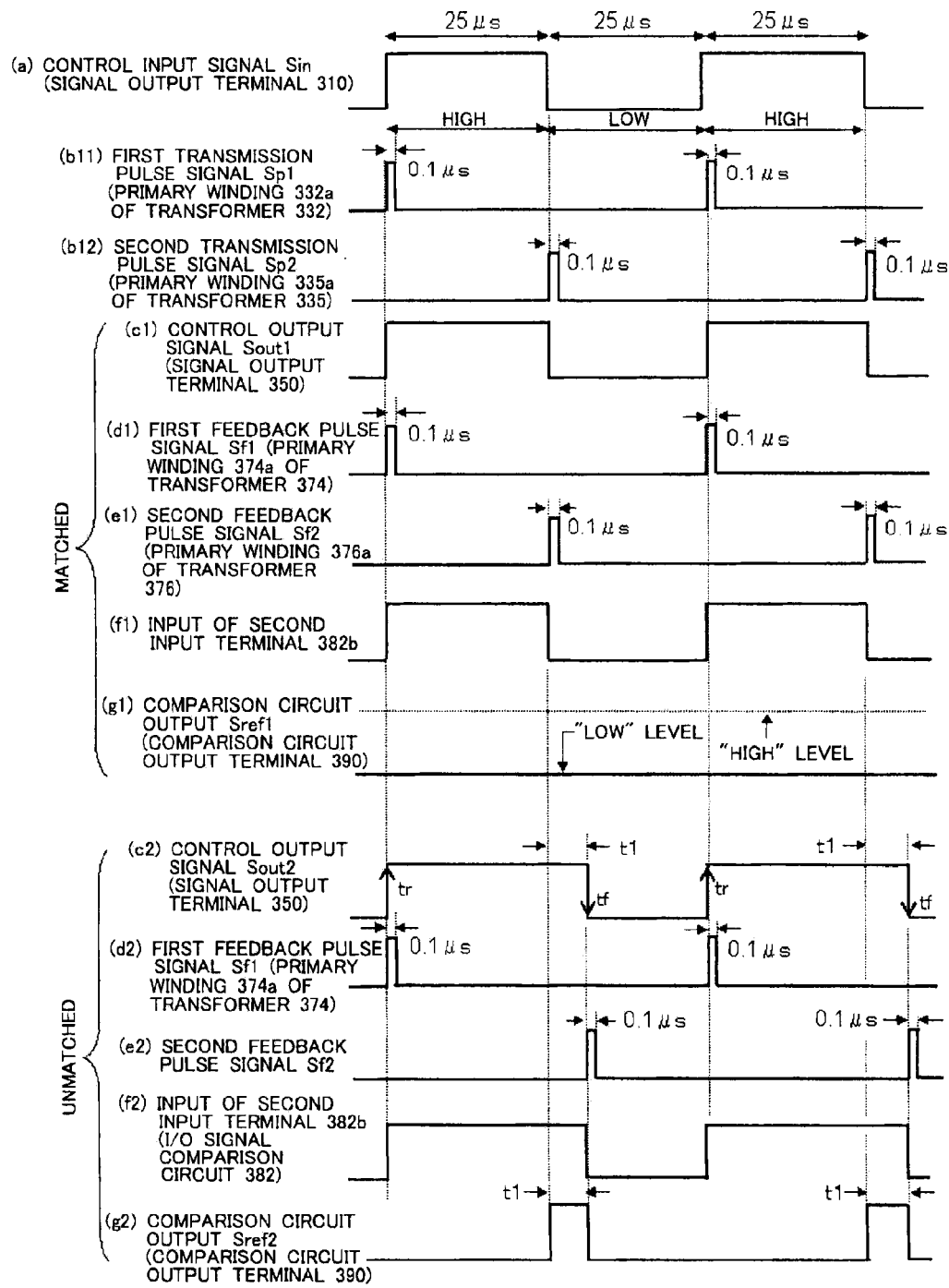
FIG. 7 is a timing chart illustrating pulse signals of different parts of the fourth embodiment of the present invention shown in FIG. 6.

FIG. 7 is a timing chart illustrating signals of parts, shown in FIG. 6, of this embodiment. FIGS. 7(a), (b11), (b12), (c1), (d1), (e1), (f1), and (g1) schematically illustrate signals in a case where the control output signal Sout1 is restored faithfully to the control input signal Sin, namely in a case where the two signals are "matched." Moreover, 7(a), (b11), (b12), (c2), (d2), (e2), (f2), and (g2) schematically illustrate signals in a case where the control output signal Sout2 is not restored faithfully to the control input signal Sin, namely in a case where the two signals are "unmatched."

FIG. 7(a) represents the control input signal Sin inputted to the signal input terminal 310. The control input signal Sin is used, for example, as a drive signal for the power semiconductor and the motor. The control input signal Sin has its duty ratio of 50% with "High" and "Low" periods of 25 □s for each. In a case where the drive signal for the motor has undergone pulse width modulation (PWM), the duty ratio of the control input signal Sin is varied over time.

FIG. 7(b11) represents the first transmission pulse signal Sp1 outputted from the first edge detector 324, and then inputted to the primary winding 332a of the first transformer 332. From the secondary winding 332b of the first transformer 332, a pulse signal approximately equivalent to the first transmission pulse signal Sp1 is then outputted.

FIG. 7(b12) represents the second transmission pulse signal Sp2 outputted from the second edge detector 328, and then inputted to the primary winding 335a of the second transformer 335. From the secondary winding 335b of the second transformer 335, a pulse signal approximately equivalent to the second transmission pulse signal Sp2 is then outputted. The first transmission pulse signal Sp1 has its pulse width set to, for example, 0.1 □s, sufficiently smaller than 25 □s of the control input signal Sin.

The pulse signals approximately equivalent to the first and second transmission pulse signals Sp1 and Sp2 are inputted to the set and reset terminals S and R of the RS-flipflop 344, respectively. The second transmission pulse signal Sp2 has its pulse width set to, for example, 0.1 □s, equal to that of the first transmission pulse signal Sp1.

FIG. 7(c1) represents the control output signal Sout1 outputted from the output terminal Q of the RS-flipflop 344 to the signal output terminal 350. The control output signal Sout1 are restored, in waveform and phase, to the control input signal Sin, and is then outputted.

FIG. 7(d1) represents the first feedback pulse signal Sf1 outputted from the third edge detector 364, and then inputted to the primary winding 374a of the first feedback transformer 374. From the secondary winding 374b of the feedback transformer 374, a pulse signal approximately equivalent to the first feedback pulse signal Sf1 is outputted.

FIG. 7(e1) represents the second feedback pulse signal Sf2 outputted from the fourth edge detector 368, and then inputted to the primary winding 376a of the second feedback transformer 376. From the secondary winding 376b of the second transformer 376, a pulse signal approximately equivalent to the second feedback pulse signal Sp2 is outputted.

FIG. 7(f1) represents an input of the second input terminal 382b outputted from the output terminal Q of the RS-flipflop 381, where the relevant signal is set by the first feedback pulse signal Sf1 and reset by the second feedback pulse signal Sf2, and thus having a duty ratio of approximately 50%. This signal is approximately equivalent to the control input signal Sin shown in shown in FIG. 7(a) and the control output signal Sout1 shown in FIG. 7(c1). That is, this signal depicts a state where that the control output signal Sout1 is matched with the control input signal Sin.

FIG. 7(g1) represents the comparison circuit output Sref1 outputted to the comparison signal output terminal 390. That is, the control input signal Sin shown in FIG. 7(a) coincides with the input of the second input terminal 382b shown in FIG. 7(f1); thus, when the two signals are inputted to the exclusive OR circuit, the exclusive OR circuit then outputs a signal indicating that the two signals are "matched", namely "Low" level as shown in FIG. 7(g1). Needless to say, "High" level may be outputted here.

Next, a case where the two signals are "unmatched" will be described. Waveforms shown in FIGS. 7(a), (b11), and (b12) are same as in the case where the two signals are "matched," and thus, no overlapping description on them will be given in the following description.

FIG. 7(c2) represents the control output signal Sout2 outputted to the signal output terminal 350, and having its pulse width larger, increased by t1, than the control input signal Sin. With such a signal waveform as shown in FIG. 7(c2), it is impossible to determine that the control output signal Sout2 is restored faithfully to the control input signal Sin. That is, the signal waveform shown in FIG. 7(c2) should be considered as "unmatched" with the control input signal Sin.

FIG. 7(d2) represents the first feedback pulse signal Sf1 outputted from the third edge detector 364, and then inputted to the primary winding 374a of the first feedback transformer 374. From the secondary winding 374b of the first feedback transformer 374, a pulse signal approximately equivalent to the first feedback pulse signal Sf1 is outputted. The first feedback pulse signal Sf1 is generated in synchronization with the rising edge of the control output signal Sout2 shown in FIG. 7(c2).

FIG. 7(e2) represents the second feedback pulse signal Sf2 outputted from the fourth edge detector 368, and then inputted to the primary winding 376a of the second feedback transformer 376. From the secondary winding 376b of the secondary feedback transformer 376, a pulse signal approximately equivalent to the second feedback pulse signal Sf2 is outputted. The second feedback pulse signal Sf2 is generated in synchronization with a falling edge tf of the control output signal Sout2 shown in FIG. 7(c2), thus having a waveform deviating from an original waveform.

FIG. 7(f2) represents an input of the second input terminal 382b generated by passing through the RS-flipflop 381, where the relevant signal is set by the first feedback pulse signal Sf1 and reset by the second feedback pulse signal Sf2 shown in FIGS. 7(d2) and (e2), respectively. The signal shown in FIG. 7(f2) corresponds to the control output signal Sout2 as a result of restoration; thus, it is obvious that the signal is not restored faithfully to the control input signal Sin.

The comparison circuit output Sref2 shown in FIG. 7(g2) is an output for a case where the control input signal Sin shown in FIG. 7(a) and the input of the second input terminal 382b shown in FIG. 7(f2) are inputted to the exclusive OR circuit, and is then transferred to the comparison signal output terminal 390. This output is then transferred further to the electronic control device 32, as a signal indicating the control output signal Sout2 is not matched with the control input signal Sin, namely an "unmatched" result of the comparison between the two signals. If the two signals are determined to be "unmatched," the electronic control device 32 then controls the signal transfer circuit device 300. If the control output signal Sout2 is not matched with the control input signal Sin, the relevant output may exhibit a polarity opposite to that shown in FIG. 7(g2).

Figure 8:
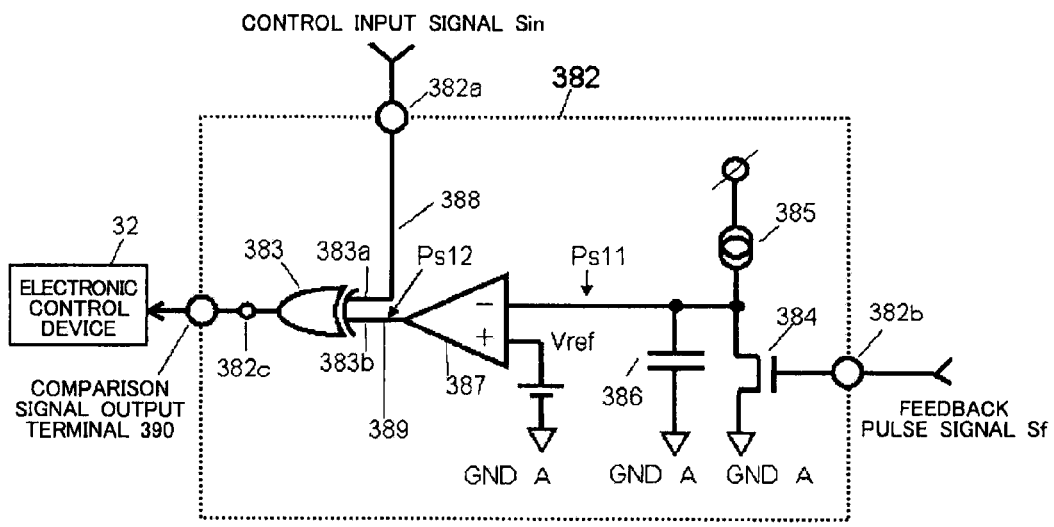
FIG. 8 is a schematic diagram specifically showing an I/O signal comparison circuit according to the present invention.

FIG. 8 specifically shows a circuit configuration of the I/O signal comparison circuit 382 provided as a main circuit of the second receiver circuit 380 of the present invention. The I/O signal comparison circuit 382 is provided with a switching transistor 384, a current source 385, and a capacitor 386 that together form the first pulse waveform-shaping circuit. The first pulse waveform-shaping circuit is a so-called charging and discharging circuit, where the capacitor 386 performs charging and discharging repeatedly at small intervals, during a period when the feedback pulse signal Sf is present, and thereby generates a shaped pulse signal that seemingly have ripple components. Moreover, the I/O signal comparison circuit 382 is provided with a comparator 387 that forms the second pulse waveform-shaping circuit. An unillustrated inverter may be provided in a stage succeeding to the comparator 387 for matching a polarity of a signal. The I/O signal comparison circuit 382 is further provided with an exclusive OR circuit 383.

It is preferable that the first and second pulse waveform-shaping circuits provided in the I/O signal comparison circuit 382 be adopted in the above-described first, second and third embodiments. This is because in the first, second and third embodiments, the feedback pulse signal Sf inputted to the second input terminal 382b of the I/O signal comparison circuit 382 is a signal modulated by the control output signal Sout, and needs to be shaped into a digital signal that can be directly compared with the control input signal Sin in a case where the I/O signal comparison circuit 382 is formed with, as its main circuit, the exclusive OR circuit. On the other hand, in the fourth embodiment of the present invention, provision of the first and second pulse waveform-shaping circuits is not a mandatory requirement. This is because, according to the fourth embodiment, a digital signal that can be directly compared with the control input signal Sin is inputted to the second input terminal 382b of the I/O signal comparison circuit 382.

The control input signal Sin is inputted to the first input terminal 382a of the I/O signal comparison circuit 382. The control input signal Sin is then inputted to the first input terminal 383a of the exclusive OR circuit 383 through a signal line 388. The control input signal Sin serves as a reference signal of the I/O signal comparison circuit 382.

The feedback pulse signal Sf is inputted to the second input terminal 382b of the I/O signal comparison circuit 382. The switching transistor 384 is repeatedly turned on and off in accordance with the "High" and "Low" level of the feedback pulse signal Sf. The current source 385 and the capacitor 386 work together with the switching transistor 384 so as to generate a first shaped pulse signal Ps11. The first shaped pulse signal Ps11 thus generated appears at one end of the capacitor 386, then passes through the comparator 387, where the first shaped pulse signal Ps11 is shaped into a rectangular waveform signal by the comparator 387, so as to generate a second shaped pulse signal Ps12. The comparator 387 is fed with a reference voltage Vref, and the first transmitted pulse signal Ps11 is shaped based on the reference voltage Vref so as to generate the second shaped pulse signal Ps12. That is, the first shaped pulse signal Ps11 is shaped, by the comparator 387, into the second shaped pulse signal Ps12 that can be directly compared with the control input signal Sin.

The second shaped pulse signal Ps12 is inputted to a second input terminal 383b of the exclusive OR circuit 383 through a signal line 389. When the control input signal Sin and the second shaped pulse signal Ps12 are inputted to the first and second input terminals 383a and 383b of the exclusive OR circuit 383, respectively, the I/O signal comparison circuit 382 then outputs, from its output terminal 382c, an output of the exclusive OR circuit 383 at "High" level during a period when the two signals are mutually different in level. Needless to say, the output terminal 382c may be so arranged as to output the "Low" level. In either case, if the control input signal Sin and the second shaped pulse signal Ps12 are unmatched, an "unmatched" part of the second shaped pulse signal Ps12 appears as the output of the exclusive OR circuit 383, and is then transferred to the comparison signal output terminal 390.

The second receiver circuit 380 may be provided with, other than the I/O signal comparison circuit 382, an unillustrated signal delay circuit and the like on a signal line extending from the first input terminal 382a to the second input terminal 382b. The signal delay circuit thus arranged can cancel out a delay occurring on a side of a feedback signal. Note that a ground potential of the I/O signal comparison circuit 382 is preferably connected to GND A.

Figure 9:
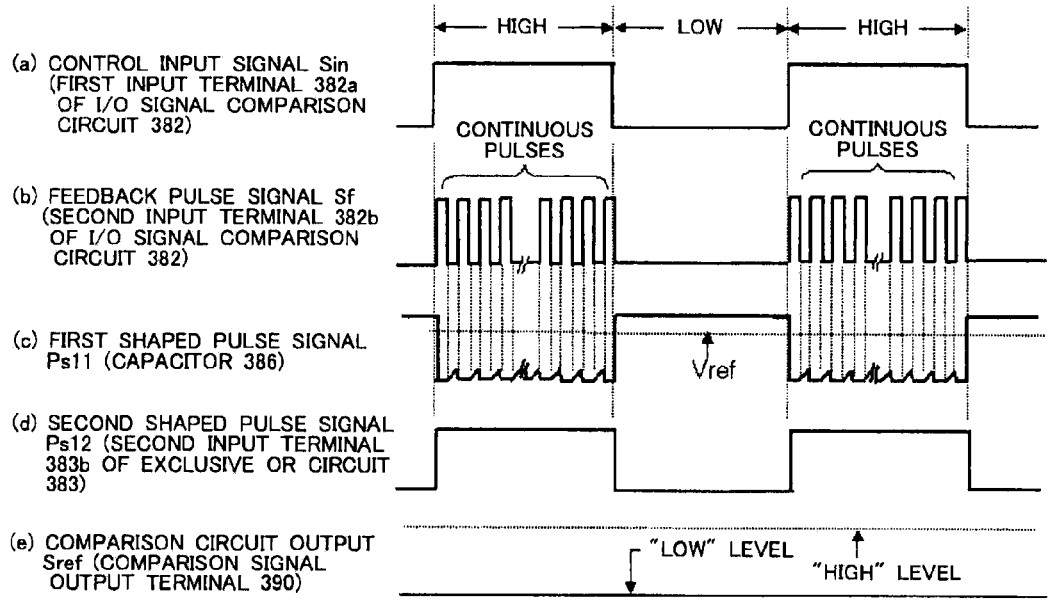
FIG. 9 is a timing chart illustrating different parts forming the I/O signal comparison circuit according to the present invention shown in FIG. 8.
Figure 10:
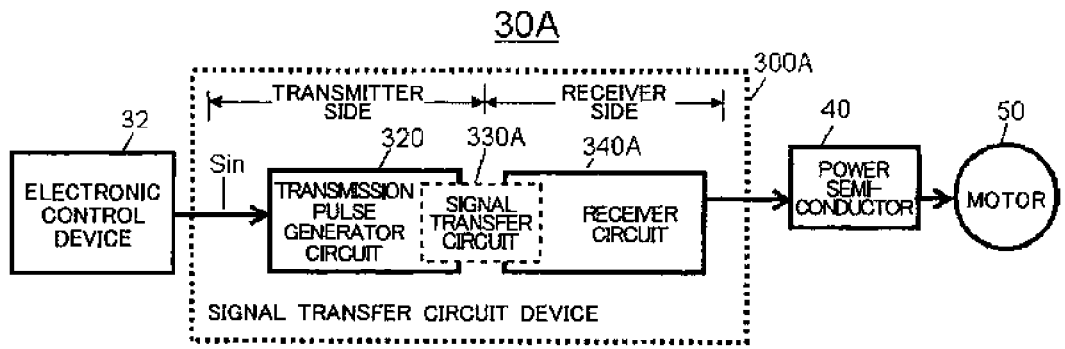
FIG. 10 is a diagram showing a conventional power semiconductor drive circuit device.
Figure 11:
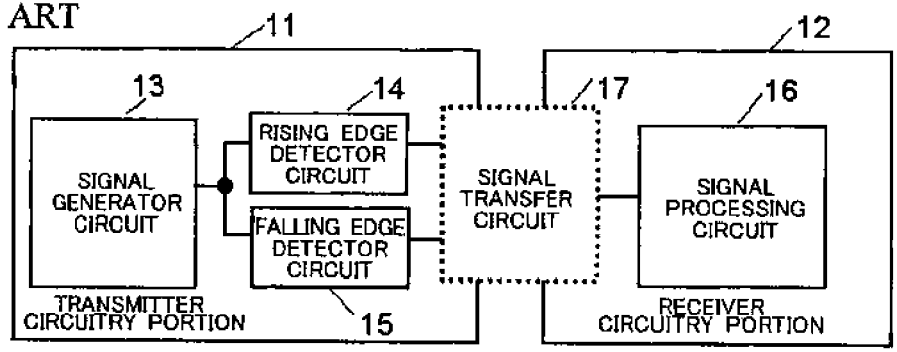
FIG. 11 is a diagram showing a conventional signal transfer circuit device.
Figure 12:
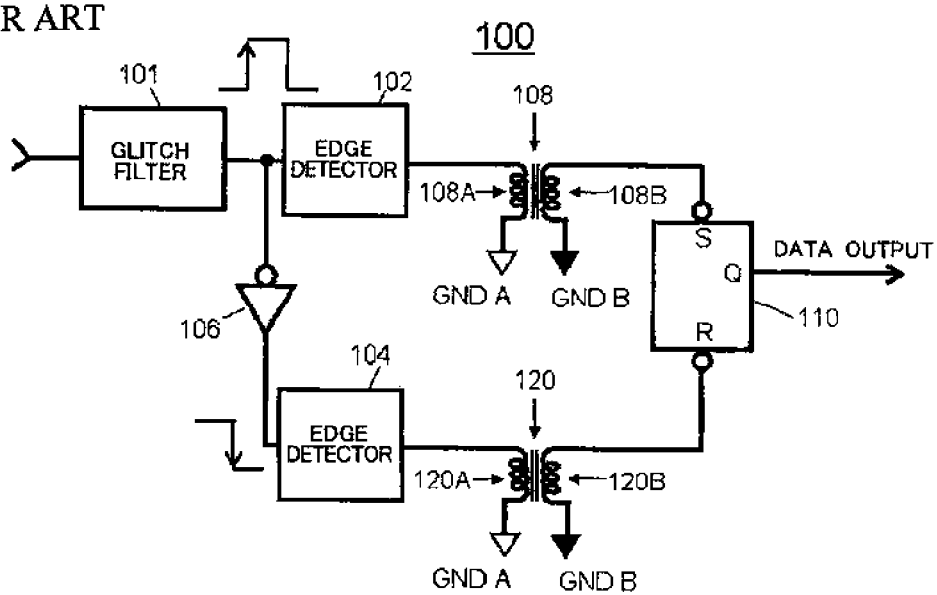
FIG. 12 is another diagram showing a conventional drive circuit device for a power semiconductor.

FIG. 9 is a timing chart illustrating signals of parts forming the I/O signal comparison circuit 382.

FIG. 9(a) represents the control input signal Sin. The control input signal Sin is prepared as a reference signal of the I/O signal comparison circuit 382. The control input signal Sin is inputted to the first input terminal 383a of the exclusive OR circuit shown in FIG. 8, via the first input terminal 382a, through a signal line 388.

FIG. 9(b) represents the feedback pulse signal Sf. The feedback pulse signal Sf is inputted to the second input terminal 382b of the I/O signal comparison circuit 382. The feedback pulse signal Sf is set so that its continuous pulse starts and ends within a period for which the control output signal Sout is "High." Needless to say, the continuous pulse may be so arranged as to start and end within a period for which the control output signal Sout is "Low."

FIG. 9(c) represents the first shaped pulse signal Ps11. The first shaped pulse signal Ps11 is obtained by making the feedback pulse signal Sf shown in FIG. 9(a) pass through the first pulse waveform-shaping circuit provided in the I/O signal comparison circuit 382, where the feedback pulse signal Sf is shaped into the first shaped pulse signal Ps11. The first pulse waveform-shaping circuit is provided with the switching transistor 384, the current source 385, and the capacitor 386 as shown in FIG. 8.

FIG. 9(d) represents the second shaped pulse signal Ps12. The second pulse shaped signal Ps12 is obtained by making the first shaped pulse signal Ps11 pass through the second pulse waveform-shaping circuit provided in the I/O signal comparison circuit 382, where the first shaped pulse signal Ps11 is shaped into the second shaped pulse signal Ps12. A main circuit of the second pulse waveform-shaping circuit is the comparator 387 shown in FIG. 8. The comparator 387 is fed with a reference potential Vref, and the first shaped pulse signal Ps11 is shaped in line with the reference potential Vref. Note that an unillustrated inverter may be provided in a stage succeeding to the comparator 387 so as to reverse a polarity of the second shaped pulse signal Ps12.

FIG. 9(e) represents the comparison circuit output Sref of the I/O signal comparison circuit 382 outputted from the output terminal 382c of the I/O signal comparison circuit 382. This comparison circuit output Sref is transferred onto the comparison signal output terminal 390. The comparison circuit output Sref shown in FIG. 9(e) indicates "Low" level. That is, the control input terminal shown in FIG. 9(a) and the second shaped pulse signal Ps12 are matched; accordingly, the figure shows, by way of example, the output terminal 382c of the I/O signal comparison circuit 382 (comparison output terminal 390) outputs "Low" level. Needless to say, if the control input signal Sin shown in FIG. 9(a) and the second shaped pulse signal Ps12 are unmatched, a different portion between the two signals is then outputted at "High" level to the comparison signal output terminal 390. Note that these signals may exhibit polarities so that either has a polarity opposite to the other.

From the viewpoint of industrial applicability of the present invention, a power semiconductor drive circuit device and a signal transfer circuit device according to any one of the embodiments of the present invention specifically described herein are provided with a self-diagnosis function, making it possible to monitor a malfunction, owing to noise or the like produced internally or externally, leading to the device deviating from its normal operating state, and to maintain or recover the device in a preferable state based on a signal indicating a condition of the malfunction; therefore, the present invention has high industrial applicability.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. A power semiconductor drive circuit device comprising:
an electronic control device generating a control input signal;
a signal transfer circuit device generating a control output signal obtained by being restored to the control input signal; and
a power semiconductor driven by the control output signal outputted from the signal transfer circuit device,
wherein the signal transfer circuit device includes a self-diagnosis functional block to compare the control output signal with the control input signal, and then to transfer an output obtained by the self-diagnosis functional block to the electronic control device, wherein the self-diagnosis functional block is provided with a photocoupler, and
wherein the electronic control device controls the signal transfer circuit device based on the output obtained by the self-diagnosis functional block.

2. A power semiconductor drive circuit device comprising:
an electronic control device generating a control input signal;
a signal transfer circuit device generating a control output signal obtained by being restored to the control input signal; and
a power semiconductor driven by the control output signal outputted from the signal transfer circuit device,
wherein the signal transfer circuit device includes a self-diagnosis functional block to compare the control output signal with the control input signal, and then to transfer an output obtained by the self-diagnosis functional block to the electronic control device, wherein the self-diagnosis functional block is provided with a transformer, and
wherein the electronic control device controls the signal transfer circuit device based on the output obtained by the self-diagnosis functional block.

3. A signal transfer circuit device, comprising:
a signal input terminal receiving a control input signal;
a transmission pulse generator circuit generating a transmission pulse signal that is synchronized with the control input signal;

a first signal transfer circuit transferring the transmission pulse signal to a stage succeeding thereto;

a first receiver circuit receiving the transmission pulse signal outputted from the first signal transfer circuit, and then restoring the transmission pulse signal to a signal approximately equivalent to the control input signal;

a signal output terminal from which the signal thus restored is outputted as a control output signal;

a feedback pulse transmitter circuit generating a feedback pulse signal that is synchronized with the control output signal;

a second signal transfer circuit transferring the feedback pulse signal to a succeeding stage; and a second receiver circuit receiving the control input signal and the feedback pulse signal, and then comparing a signal whose waveform is shaped based on the feedback pulse, with the control input signal.

4. The signal transfer circuit device according to claim 3, wherein the transmission pulse generator circuit is provided with an edge detector detecting a rising edge and a falling edge of the control input signal, and then generating the transmission pulse signal, the first signal transfer circuit is provided with a transformer having a primary winding thereof to which the transmission pulse signal is inputted, and a secondary winding thereof from which a signal approximately equivalent to the transmission pulse signal is outputted, the first receiver circuit is provided with D-flipflop outputting the signal restored to the control input signal, the feedback pulse transmitter circuit is provided with a pulse generator circuit generating the feedback pulse signal synchronized with the control output signal, and having continuous pulses during a period when the control output signal is "High" or during a period when the control output signal is "Low," and the second signal transfer circuit is provided with a feedback transformer having a primary winding thereof to which the feedback pulse signal is inputted, and a secondary winding thereof from which a pulse signal approximately equivalent to the feedback pulse signal is outputted.

5. The signal transfer circuit device according to claim 4, wherein the primary and the secondary windings, each included in the transformer and the feedback transformer, are individually connected to ground potentials provided separately from each other.

6. The signal transfer circuit device according to claim 3, wherein the transmission pulse generator circuit is provided with: a first edge detector detecting a rising edge of the control input signal, and then generating, as the transmission pulse signal, a first transmission pulse signal; and a second edge detector detecting a falling edge of the control input signal, and then generating, as the transmission pulse signal, a second transmission pulse signal, the first signal transfer circuit is provided with: a first transformer and a second transformer each having a primary winding thereof to which the first and the second transmission pulse signals are inputted, respectively, and a secondary winding thereof from which pulse signals approximately equivalent to the first and the second transmission pulse signals are outputted, respectively, the first receiver circuit is provided with an RS-flipflip having a set terminal thereof and a reset terminal thereof to which the pulse signals outputted from the secondary windings of the first and the second transformers are inputted, respectively, the RS-flipflop having an output thereof transferred to the signal output terminal, the feedback pulse transmitter circuit is provided with a pulse generator circuit generating, in synchronization with the control output signal, a feedback pulse signal having continuous pulses during a period when the control output signal is "High" or during a period when the control output signal is "Low," and the second signal transfer circuit is provided with a feedback transformer having a primary winding thereof to which the continuous pulses are inputted, and a secondary winding thereof from which a continuous pulse signal approximately equivalent to the continuous pulses is outputted.

7. The signal transfer circuit device according to claim 6, wherein the primary and the secondary windings, each included in the first and the second transformer, and in the feedback transformer, are individually connected to ground potentials provided separately from each other.

8. The signal transfer circuit device according to claim 3, wherein the transmission pulse generator circuit is provided with: a first edge detector detecting a rising edge of the control input signal, and then generating a first transmission pulse signal; and a second edge detector detecting a falling edge of the control input signal, and then generating a second transmission pulse signal, the first signal transfer circuit is provided with: a first transformer and a second transformer each having a primary winding thereof to which the first and the second transmission pulse signals are inputted, respectively, and a secondary winding thereof from which pulse signals approximately equivalent to the first and the second transmission pulse signals are outputted, respectively, the first receiver circuit is provided with an RS-flipflop having a set terminal thereof and a reset terminal thereof to which the pulse signals outputted from the secondary windings of the first and the second transformers are inputted, respectively, the RS-flipflop having an output thereof transferred onto the signal output terminal, the feedback pulse transmitter circuit is provided with: a third edge detector detecting a rising edge of the control output signal outputted to the signal output terminal, and then generating a first feedback pulse signal; and a fourth edge detector detecting a falling edge of the control output signal, and then generating a second feedback pulse signal, the second signal transfer circuit is provided with: a first feedback transformer and a second feedback transformer each having a primary winding thereof to which the first and the second feedback pulses are inputted, respectively, and a secondary winding thereof from which a feedback pulse signal is outputted, and the second receiver circuit is provided with an RS-flipflop having a set terminal thereof and a reset terminal thereof to which the pulse signals outputted from the secondary windings of the first and second feedback transformers are inputted, respectively.

9. The signal transfer circuit device according to claim 8, wherein the primary and the secondary windings, each included in the first and the second transformers, and in the first and the second feedback transformers, are individually connected to ground potentials provided separately from each other.

10. The signal transfer circuit device according to claim 3, wherein
the first and second signal transfer circuits each have a photocoupler as a main circuit thereof.

11. The signal transfer circuit device according to claim 3, wherein
the first and second signal transfer circuits each have a transformer as a main circuit thereof.

12. The signal transfer circuit device according to claim 3, wherein
the second receiver circuit is provided with an exclusive OR circuit.

13. The signal transfer circuit device according to claim 3, wherein
the second receiver circuit is provided with a waveform-shaping circuit shaping the feedback pulse signal into a signal approximately equivalent to the control input signal.

14. The signal transfer circuit device according to claim 13, wherein
the waveform-shaping circuit comprises:
a switching transistor turned on and off in accordance with the feedback pulse signal;
a current supply and a capacitor working together with the switching transistor, and thereby generating a first shaped pulse signal different from the feedback pulse signal;
a comparator receiving the first shaped pulse signal, and then generating a second shaped pulse signal different from the first shaped pulse signal; and
an exclusive OR circuit connected to the comparator.

15. A power semiconductor drive circuit device, comprising:
an electronic control device generating a control input signal;
a signal transfer circuit device generating a control output signal obtained by being restored to the control input signal; and
a power semiconductor driven by the control output signal outputted from the signal transfer circuit device,
wherein
the signal transfer circuit device is provided with a self-diagnosis functional block comparing the control output signal with the control input signal, and then transferring an output obtained by the self-diagnosis functional block to the electronic control device, and
the electronic control device controls the signal transfer circuit device based on the output obtained by the self-diagnosis functional block, and
wherein the signal transfer circuit device comprises:
a signal input terminal to which the control input signal is inputted;
a transmission pulse generator circuit generating a transmission pulse signal that is synchronized with the control input signal;
a first signal transfer circuit transferring the transmission pulse signal to a stage succeeding thereto;
a first receiver circuit receiving the transmission pulse signal outputted from the first signal transfer circuit, and then restoring the transmission pulse signal to a signal approximately equivalent to the control input signal;
a signal output terminal from which the signal thus restored is outputted as a control output signal;
a feedback pulse transmitter circuit generating a feedback pulse signal that is synchronized with the control output signal;
a second signal transfer circuit transferring the feedback pulse signal to a stage succeeding thereto; and
a second receiver circuit receiving the control input signal and the feedback pulse signal, and then comparing a signal whose waveform is shaped based on the feedback pulse signal, with the control input signal.

16. The power semiconductor drive circuit device according to claim 15, wherein
the transmission pulse generator circuit is provided with a edge detector detecting a rising edge and a falling edge of the control input signal, and then generating the transmission pulse signal,
the first signal transfer circuit is provided with a transformer having a primary winding thereof to which the transmission pulse signal is inputted, and a secondary winding thereof from which a pulse signal approximately equivalent to the transmission pulse signal is outputted,
the first receiver circuit is provided with a D-flipflop outputting a signal restored to the control input signal,
the feedback pulse transmitter circuit is provided with a pulse generator circuit generating, in synchronization with the control output signal, the feedback pulse signal having continuous pulses during a period when the control output signal is "High" or during a period when the control output signal is "Low," and
the second signal transfer circuit is provided with a feedback transformer having a primary winding thereof to which the feedback pulse signal is inputted, and a secondary winding thereof from which a pulse signal approximately equivalent to the feedback pulse signal is outputted.

17. The power semiconductor drive circuit device according to claim 16, wherein
the primary and secondary windings, each included in the transformer and the feedback transformer, are connected to ground potentials provided separately from each other.

18. The power semiconductor drive circuit device according to claim 15, wherein
the transmission pulse signal generator is provided with: a first edge detector detecting a rising edge of the control input signal, and then generating a first transmission pulse signal; and a second edge detector detecting a falling edge of the control input signal, and then generating a second transmission pulse signal,
the first signal transfer circuit is provided with: a first transformer and a second transformer each having a primary winding thereof to which the first and the second transmission pulse signals are inputted, respectively, and a secondary winding thereof from which pulse signals approximately equivalent to the first and the second transmission pulse signals are outputted, respectively,
the first receiver circuit is provided with an RS-flipflop having a set terminal thereof and a reset terminal thereof to which the pulse signals outputted from the secondary windings of the first and the second transformers are inputted, respectively, the RS-flipflop having an output thereof transferred to the signal output terminal,
the feedback pulse transmitter circuit is provided with a pulse generator circuit generating, in synchronization with the control output signal, a feedback pulse signal having continuous pulses during a period when the control output signal is "High" or during a period when the control output signal is "Low," and the second signal transfer circuit is provided with a feedback transformer having a primary winding thereof to which the continuous pulses are inputted, and a secondary winding thereof from which a continuous pulse signal approximately equivalent to the continuous pulses is outputted.

* * * * *